United States Patent [19]
Gotoh et al.

[11] Patent Number: 5,824,608
[45] Date of Patent: Oct. 20, 1998

[54] SEMICONDUCTOR PHYSICAL-QUANTITY SENSOR AND METHOD FOR MANUFACTURING SAME

[75] Inventors: Yoshitaka Gotoh, Toyoake; Makiko Fujita, Nisshin; Yukihiro Takeuchi, Nishikamo-gun, all of Japan

[73] Assignee: Nippondenso Co., Ltd., Kariya, Japan

[21] Appl. No.: 671,473

[22] Filed: Jun. 27, 1996

[30] Foreign Application Priority Data

Jun. 27, 1995 [JP] Japan ................................. 7-161065

[51] Int. Cl.$^6$ .................................................. H01L 29/82
[52] U.S. Cl. ......................... 438/745; 257/254; 257/415; 73/514.01
[58] Field of Search ............................. 438/745; 257/254, 257/415; 73/514.01

[56] References Cited

U.S. PATENT DOCUMENTS

| | | | |
|---|---|---|---|
| 5,123,282 | 6/1992 | Ikeda et al. | 73/704 |
| 5,326,726 | 7/1994 | Tsang et al. | 437/228 |
| 5,447,068 | 9/1995 | Tang | 73/514.32 |
| 5,500,549 | 3/1996 | Takeuchi et al. | 257/415 |
| 5,627,397 | 5/1997 | Kano et al. | 257/417 |

FOREIGN PATENT DOCUMENTS

| | | |
|---|---|---|
| 63-95360 | 4/1988 | Japan . |
| 4-504003 | 7/1992 | Japan . |
| 4-286165 | 10/1992 | Japan . |
| 92/03740 | 3/1992 | WIPO . |

*Primary Examiner*—Mark Chapman
*Attorney, Agent, or Firm*—Cushman Darby & Cushman IP Group of Pillsbury Madison & Sutro LLP

[57] ABSTRACT

A polysilicon thin film is formed on a silicon substrate by LPCVD technique. At this time, by a performing film formation at a low temperature of approximately 620° C., for example, an irregularities portion is formed on the surface thereof. A silicon oxide film that serves as a sacrificial layer is formed thereon and, on this sacrificial layer, a polysilicon thin film that serves as a movable portion forming thin film is formed. Then, the silicon oxide film beneath this polysilicon thin film is removed by wet etching to thereby form a movable portion. As a result, the movable portion of a beam structure that is composed of the thin film is disposed over the silicon substrate at a prescribed distance therefrom. Although an etchant-replacing liquid enters between the movable portion and the substrate whereby the movable portion is attracted toward the substrate, the movable portion is prevented from adhering to the substrate by means of the irregularities portion.

40 Claims, 18 Drawing Sheets

SEMICONDUCTOR PHYSICAL-QUANTITY SENSOR AND METHOD FOR MANUFACTURING SAME

CROSS REFERENCE TO RELATED APPLICATION

This application is based upon and claims the benefit of priority of the prior Japanese Patent Application No. 7-161065 filed on Jun. 27, 1995, the contents of which are incorporated herein by reference.

BACKGROUND OF THE INVENTION

1. Field of the Invention

The present invention relates to a semiconductor physical-quantity sensor having a beam-structural movable portion that is composed of a thin film. The invented semiconductor physical-quantity sensor can be utilized for detecting a physical quantity such as an acceleration, yaw rate, vibration or the like.

2. Related Arts

Recently, there has been an increasing demand for a reduction in size and cost of the semiconductor acceleration sensor. As a proposal for satisfying this demand, a differential capacitance type semiconductor acceleration sensor that uses polysilicon as the electrodes is shown in Published Unexamined Japanese Patent Application No. 4-504003. This type of sensor will now be explained with reference to FIGS. 40 and 41. FIG. 40 is a plan view illustrating the sensor and FIG. 41 is a sectional view taken along line XLI—XLI of FIG. 40.

A movable portion 51 of a beam structure is disposed above a silicon substrate 50 with a prescribed gap therebetween. The movable portion 51 of a polysilicon thin film comprises beam portions 52, 53, 54 and 55, weight portion 56 and movable electrode portions 57. The movable portion 51 is fixed to an upper surface of the silicon substrate 50 by anchor portions 58, 59, 60 and 61. That is, the beam portions 52, 53, 54 and 55 are extended from the anchor portions 58, 59, 60 and 61 respectively. The weight portion 56 is supported by these beam portions 52, 53, 54 and 55. The movable electrode portions 57 protrude from this weight portion 56. On the other hand, on the silicon substrate 50, two stationary electrodes 62 are disposed with respect to one movable electrode portion 57 in such a manner as to oppose each other with this portion 57 therebetween. When an acceleration has been applied in a direction (the direction indicated by the symbol G in FIG. 40) parallel to the surface of the silicon substrate 50, one of the capacitances between the movable electrode portions 57 and the stationary electrode 62 increases and the other decreases.

This sensor is manufactured as follows. As illustrated in FIG. 42, a sacrificial layer 63 such as a silicon oxide film is formed on the silicon substrate 50 and openings 64 are formed at portions thereof that become the anchor portions. Thereafter, as illustrated in FIG. 43, a polysilicon thin film 65 that becomes the movable portion is deposited on the sacrificial layer 63 and is patterned as desired. Thereafter, the sacrificial layer 63 beneath the polysilicon thin film 65 that excludes the anchor portions is removed by an etching solution to thereby cause the movable portion 51 to be disposed above the substrate 50 at a prescribed spacing therebetween as illustrated in FIG. 44.

Explaining the removal step for removing the sacrificial layer by this wet etching in greater detail, as illustrated in FIG. 45, the silicon substrate 50 is immersed in an etching solution 66 whereby the sacrificial layer 63 is etched. Thereafter, as illustrated in FIG. 46, the silicon substrate 50 is immersed in pure water 67 to thereby replace the etching solution 66 adhering on the surface of the silicon substrate 50 with the pure water 67. Thereafter, the silicon substrate 50 is drawn out from the pure water 67 and is dried. As a result, the structure becomes as illustrated in FIG. 44.

However, when this pure water is dried up, as illustrated in FIG. 47 a droplet of pure water 68 is left between the silicon substrate 50 and the movable portion 51 whereupon the movable portion 51 is attracted toward the surface of the silicon substrate 50 by the surface tension of this pure water 68. As a result, as illustrated in FIG. 48, the movable portion 51 is inconveniently caused to adhere to the surface of the silicon substrate 50.

A technology for avoiding this inconvenience is disclosed in Published Unexamined Japanese Patent Application No. 4-286165. In this technology, by immersing the substrate into a solution of ($HF+CH_3COOH+HNO_3$), irregularities are formed on the surface thereof, whereby a sacrificial layer and polysilicon thin film (movable portion forming thin film) are formed on the resulting substrate. Then, by etching the sacrificial layer, the polysilicon thin film is made into a movable portion of a beam structure. That is, forming irregularities on the upper surface of the substrate it aimed to ease the effect of the surface tension that occurs when flat surfaces have been disposed closely to each other.

However, since irregularities are formed on the surface of the substrate by immersing the substrate into the solution of ($HF+CH_3COOH+HNO_3$), damage is caused to the substrate. Namely, for example, when an attempt is made to form a semiconductor element (transistor, etc.) in a surface layer portion of the substrate, undesirable effects follow.

SUMMARY OF THE INVENTION

In view of the above, an object of the present invention is to provide a semiconductor physical-quantity sensor which, when forming a beam-structural movable portion by etching of sacrificial layer, enables prevention of adhering of this movable portion to the substrate without affecting the element characteristics.

The semiconductor physical-quantity sensor according to the present invention adopts a novel technique of not forming irregularities on the surface of the substrate itself but disposing an underlying film having an irregular surface between the substrate and the beam-structural movable portion or forming irregularities on the underside of the movable portion, i.e., the surface thereof that opposes the substrate.

It is to be noted that in the former case the underlying film needs to be disposed previously on the substrate surface prior to deposition of the sacrificial layer thereon. Also, as the material thereof it is necessary to select a material that is different from that of the sacrificial layer so as to prevent the underlying layer from being removed at the sacrificial layer etching time.

Also, when a MIS transistor structure is adopted as the structure of the sensor, it is necessary that the underlying film be disposed in a region other than that where the MIS transistor structure is disposed. That is, it is necessary to set the source/drain portions of the MIS transistor structure at a surface region of the semiconductor substrate and dispose the underlying film on a surface portion of the substrate right beneath the movable portion and at a position that is spaced away from the set regions for the source/drain portions. Although at this time in order to cause part of the movable portion to function as the gate of the MIS transistor structure this part needs to be extended over the source/drain portions of the surface of the substrate, this extension is determined depending not on the planar pattern of the underlying film but on the relationship between the planar pattern of the sacrificial layer and that of the movable portion.

By disposing the underlying film in such a manner as to be spaced away from the MIS transistor structure as the structure of the sensor as mentioned above, it is possible to prevent the output signal of the MIS transistor, namely the detection signal of the sensor, from being affected by the surface irregularities. For example, although it is likely that in a case where an irregularities region is disposed between the source and drain regions, the mobility of carriers therein on one hand decreases due to surface scatter thereof whereupon fluctuations occur in the output signal, or output fluctuations resulting from the temperature dependency on the other hand occur, such a likelihood can be eliminated in this structure of sensor.

Also, if the underlying film is made to have conductivity and thereby made to have the same potential as that of the movable portion, it is possible to prevent the movable portion from being attracted toward the substrate by electrostatic attraction.

Also, when irregularities are formed on the underside of the movable portion as in the latter case, it is sufficient that the surface of the sacrificial film prior to deposition of a film that becomes the movable portion has irregularities.

As mentioned above, according to the present invention, it is possible to dispose an irregularities configuration between the substrate and the movable portion without causing damage to the substrate. Accordingly, even when a semiconductor element is formed in the substrate, it does not happen that the characteristics of the element are influenced due to the irregularities configuration.

Also, of course, when the movable portion is made up into a movable structure, namely when the sacrificial film is etched, it is possible to effectively suppress the tendency for the movable portion to adhere to the substrate by use of the irregularities configuration.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS (FIRST EMBODIMENT)

A first embodiment that has embodied the present invention will now be explained with reference to the drawings.

Figure 1:
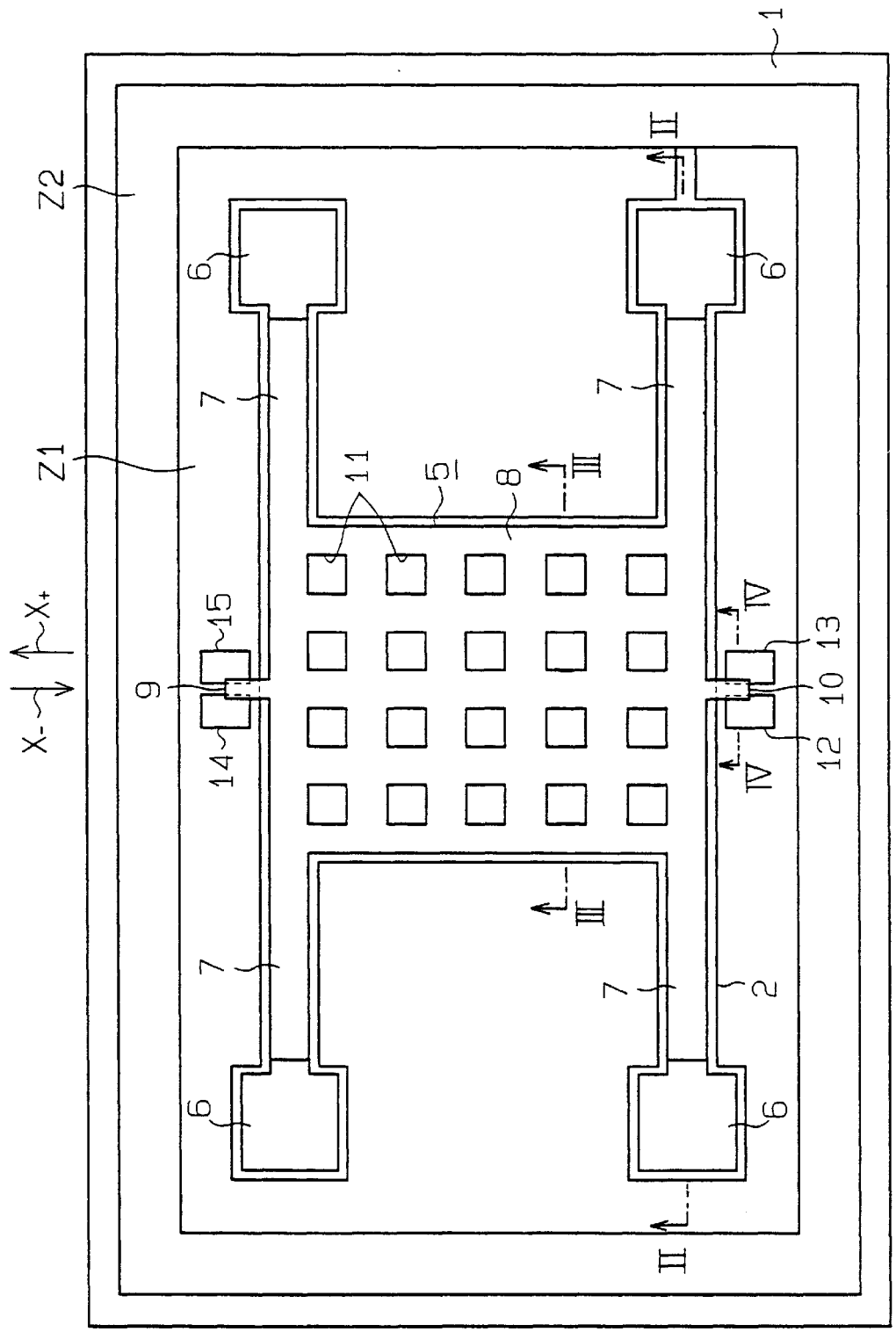
FIG. 1 is a plan view illustrating a semiconductor acceleration sensor according to a first embodiment of the present invention.
Figure 2:
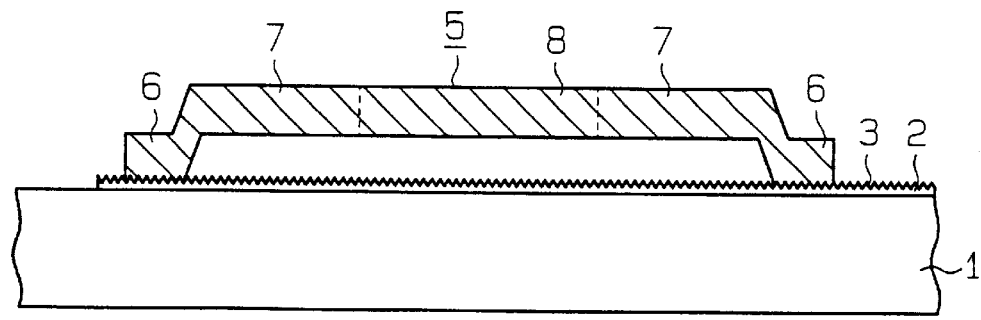
FIG. 2 is a sectional view taken along line II—II of FIG. 1.
Figure 3:
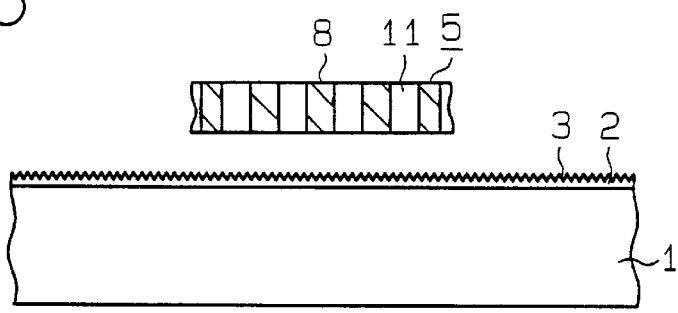
FIG. 3 is a sectional view taken along line III—III of FIG. 1.

FIG. 1 is a plan view illustrating a semiconductor acceleration sensor according to this embodiment. FIG. 2 is a sectional view taken along line II—II of FIG. 1, FIG. 3 is a sectional view taken along line III—III of FIG. 1, and FIG. 4 is a sectional view taken along line IV—IV of FIG. 1.

Referring to FIG. 1, a P-type silicon substrate 1 has thereon a movable portion forming region (sensor element forming region) Z1 formed therein with a movable portion 5 and anchor portions 6 and a peripheral circuit forming region Z2 for performing signal processing, etc.

A thin film 2 for use as wiring (hereinafter referred to simply as "wiring") that is composed of a polysilicon thin film is formed on the silicon substrate 1 in the movable portion forming region (sensor element forming region) Z1. This wiring 2 is formed in a region where the movable portion 5 and anchor portions 6 are to be formed and, on the entire upper surface of the wiring (polysilicon thin film) 2, there is formed an irregularities portion 3. The movable portion 5 that is composed of a polysilicon thin film is suspended on the wiring 2. The movable portion 5 is composed of four beam portions 7, weight portion 8 and movable gate electrode portions 9 and 10. The movable portion 5 is fixed by the four anchor portions 6 and is disposed over the silicon substrate 1 (wiring 2) with a prescribed spacing therebetween. The anchor portions 6 are composed of polysilicon and are made integral with the movable portion 5. More specifically, the four anchor portions 6 are disposed on the wiring 2 and four strip-like beam portions 7 are extended from the anchor portions 6, whereby the square-shaped weight portion 8 is supported. From the weight portion 8 the rectangular movable gate electrode portions 9 and 10 are made to protrude in directions opposite to each other. The movable portion 5 of suspended beam structure (movable gate electrode portions 9 and 10) is made displaceable in a direction perpendicular to the surface of the silicon substrate 1 and in a direction parallel thereto.

Figure 4:
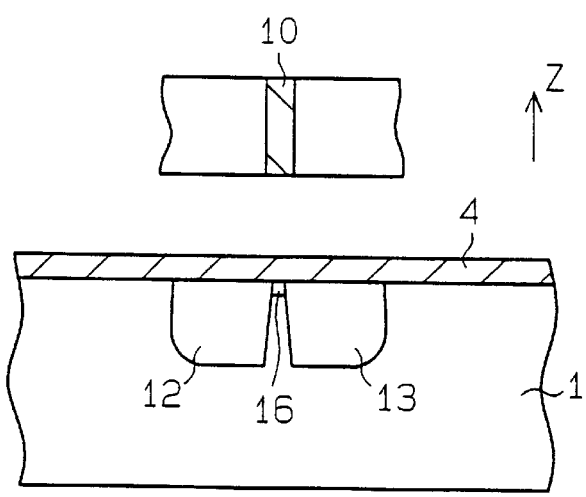
FIG. 4 is a sectional view taken along line IV—IV of FIG. 1.

As illustrated in FIG. 4, on the silicon substrate 1 located beneath the movable gate electrode portion 10 of the movable portion 5 there is formed a silicon oxide film 4 that serves as a gate insulator film, and in this silicon substrate portion there are formed stationary electrodes 12 and 13 that serve as the source and drain portions each consisting of an N-type impurity diffusion layer at positions that correspond to both sides of the movable gate electrode portion 10. Similarly, as illustrated in FIG. 1, in the silicon substrate 1 located beneath the movable gate electrode portion 9 of the movable portion 5, there are formed stationary electrodes 14 and 15 that serve as the source and drain portions each consisting of an N-type impurity diffusion layer at positions that correspond to both sides of the movable gate electrode portion 9. As illustrated in FIG. 4, between the stationary electrodes 12 and 13 in the silicon substrate 1 there is formed a channel region 16 in accordance with an application of a voltage between the silicon substrate 1 and the movable gate electrode 10. By applying a voltage between the stationary electrodes 12 and 13, drain current flows through this channel region 16. Similarly, between the stationary electrodes 14 and 15 in the silicon substrate 1 there is formed a channel region (whose illustration is omitted) by applying a voltage between the silicon substrate 1 and the movable gate electrode 9. By applying a voltage between the stationary electrodes 14 and 15, drain current flows through this channel region.

As illustrated in FIGS. 1 and 3, in the weight portion 8 of the movable portion 5 there are formed a large number of openings 11 that pass therethrough in the vertical direction. By these openings 11, an etching solution used when etching of a sacrificial layer as described later is performed easily passes therethrough.

In the peripheral circuit forming region Z2 there is formed a circuit composed of a transistor, etc. Whereby, the peripheral circuit and movable portion 5 are connected to each other by means of the wiring 2. Also, the peripheral circuit and stationary electrodes 12, 13, 14 and 15 are electrically connected to each other.

Next, the operation of this semiconductor acceleration sensor will be explained.

When a voltage is applied between the movable portion 5 and silicon substrate 1 and between the stationary electrodes 12 and 13 (14 and 15), the channel region 16 is formed and electric current flows between the stationary electrodes 12 and 13 (14 and 15). In a case where the present semiconductor acceleration sensor receives an acceleration whereupon the movable gate electrode portions 9 and 10 (movable portion 5) have been displaced in an $X_+$ direction (in a direction parallel to the surface of the substrate 1) indicated in FIG. 1, the area of the channel region between the stationary electrodes (the channel width referred to in terms of the transistor) is varied whereby the electric current flowing between the stationary electrodes 12 and 13 decreases while, on the other hand, the electric current flowing between the stationary electrodes 14 and 15 increases. In contrast, in a case where the movable gate electrode portions 9 and 10 (movable portion 5) have been displaced in an $X_-$ direction (in a direction parallel to the surface of the substrate 1) indicated in FIG. 1, the area of the channel region between the stationary electrodes (the channel width referred to in terms of the transistor) is varied whereby the electric current flowing between the stationary electrodes 12 and 13 increases while, on the other hand, the electric current flowing between the stationary electrodes 14 and 15 decreases.

On the other hand, in a case where the present semiconductor acceleration sensor receives an acceleration whereby the movable gate electrode portions 9 and 10 have been displaced in a Z direction indicated in FIG. 4 (in a direction perpendicular to the surface of the substrate 1), the above-mentioned electric currents decrease simultaneously because the carrier concentration in the channel region 16 decreases due to change in the intensity of the electric field.

As mentioned above, according to the present semiconductor acceleration sensor, as a result of a change in position of the movable gate electrode portions 9 and 10 relative to the stationary electrodes 12, 13 and to the stationary electrodes 14, 15 due to acceleration, the electric current flowing between the stationary electrodes 12 and 13 and the electric current flowing between the stationary electrodes 14 and 15 vary, with the result that it is possible to detect acceleration in two dimensions by the magnitude and phase of this change in current.

Next, the manufacturing process steps for manufacturing the acceleration sensor will be explained with reference to FIGS. 5 to 9. Each of sectional views of FIGS. 5 9 corresponds to a state of section II—II of FIG. 1.

Figure 5:
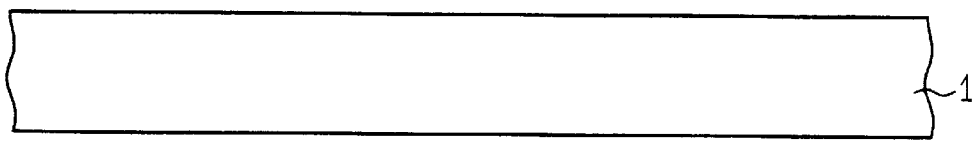
FIGS. 5 to 9 are sectional views illustrating process steps for manufacturing the semiconductor acceleration sensor.

As illustrated in FIG. 5, the P-type silicon substrate 1 that serves as a semiconductor substrate is first prepared. The upper surface of this silicon substrate 1 is made to be flat. Then, an impurity diffusion layer that becomes the stationary electrodes in the movable portion forming region and a source/drain region (impurity diffusion layer) in a transistor that constitutes the peripheral circuit are formed. At this time, since no acid treatment is performed on the substrate unlike the prior method (as disclosed in the Published Unexamined Japanese Patent Application No. 4-286165), it is possible to form desired diffusion layers in the surface of the substrate easily.

Figure 6:
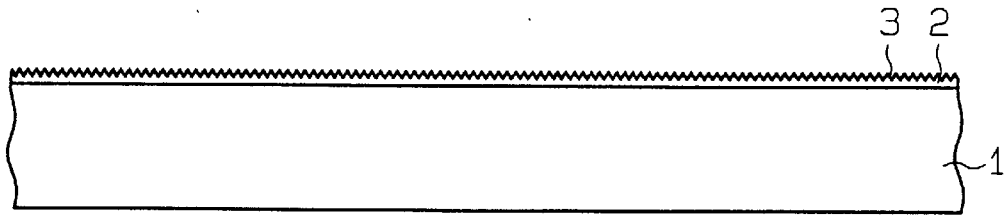

Subsequently, as illustrated in FIG. 6, the wiring 2 that is composed of a polysilicon thin film and that serves as the underlying film is formed by a LPCVD (low pressure chemical vapor deposition) technique. This film formation is performed at a low temperature of approximately 620° C. that is among the film forming conditions. By this low temperature film formation, the irregularities portion 3 is formed on the surface of the wiring (polysilicon thin film) 2. Also, the film thickness is made to be approximately 3,700 Å.

Figure 10A:
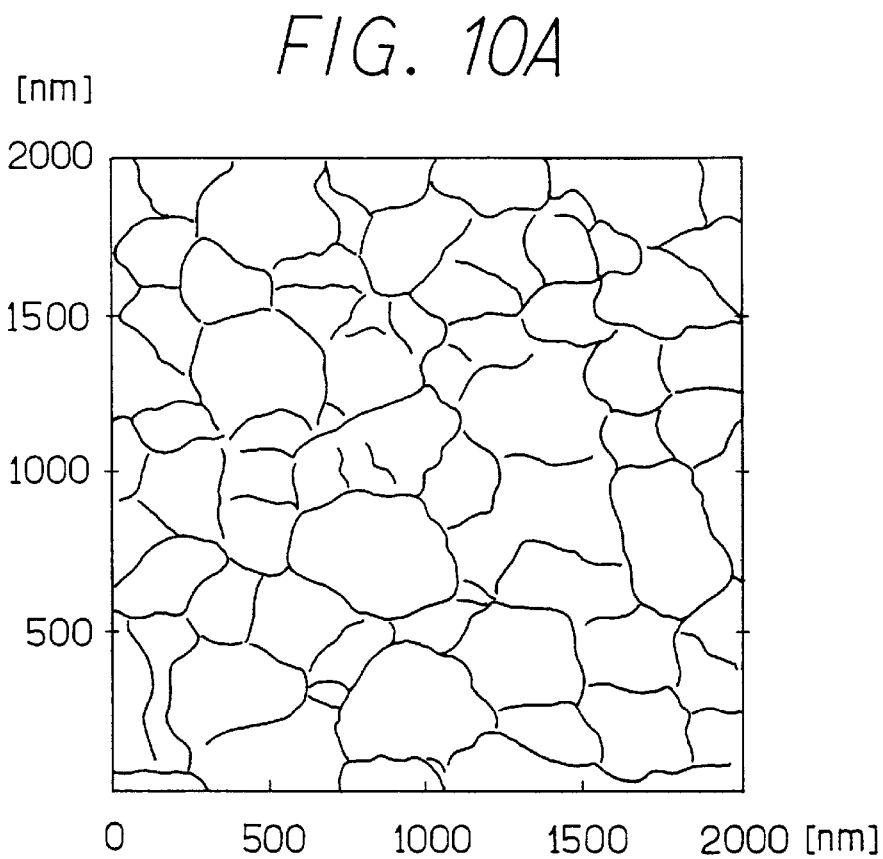
FIGS. 10A and 10B and FIGS. 11A and 11B are illustrative views of states of surface of the underlying film.
Figure 10B:
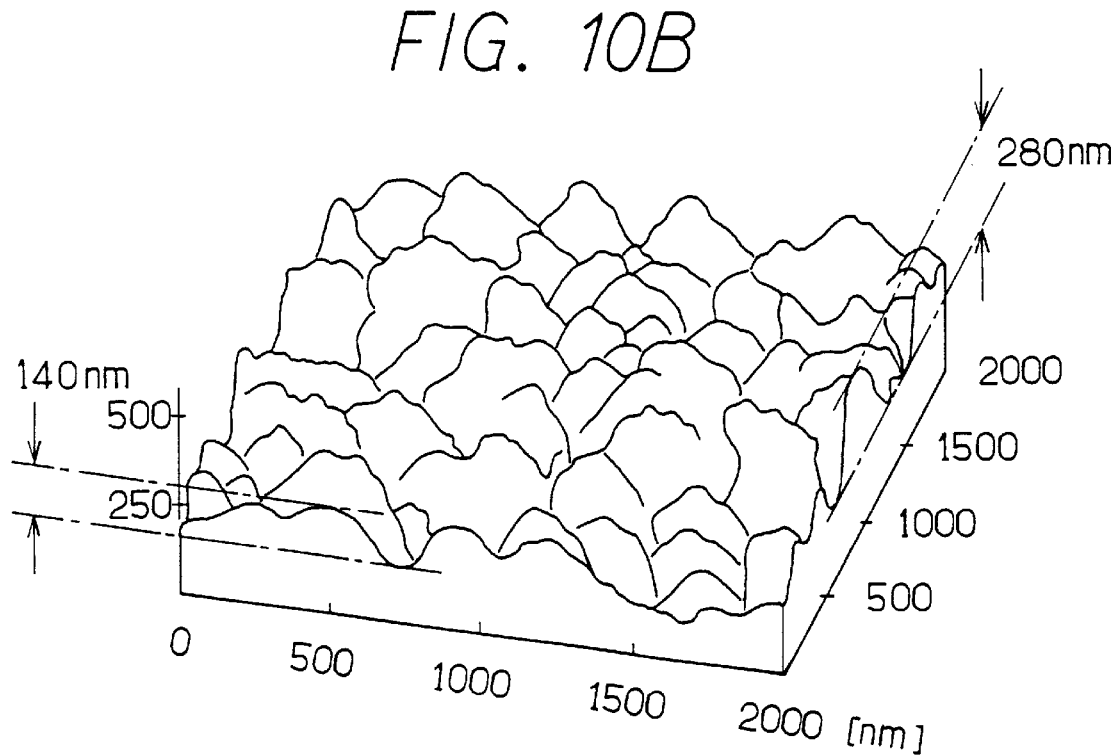
Figure 11A:
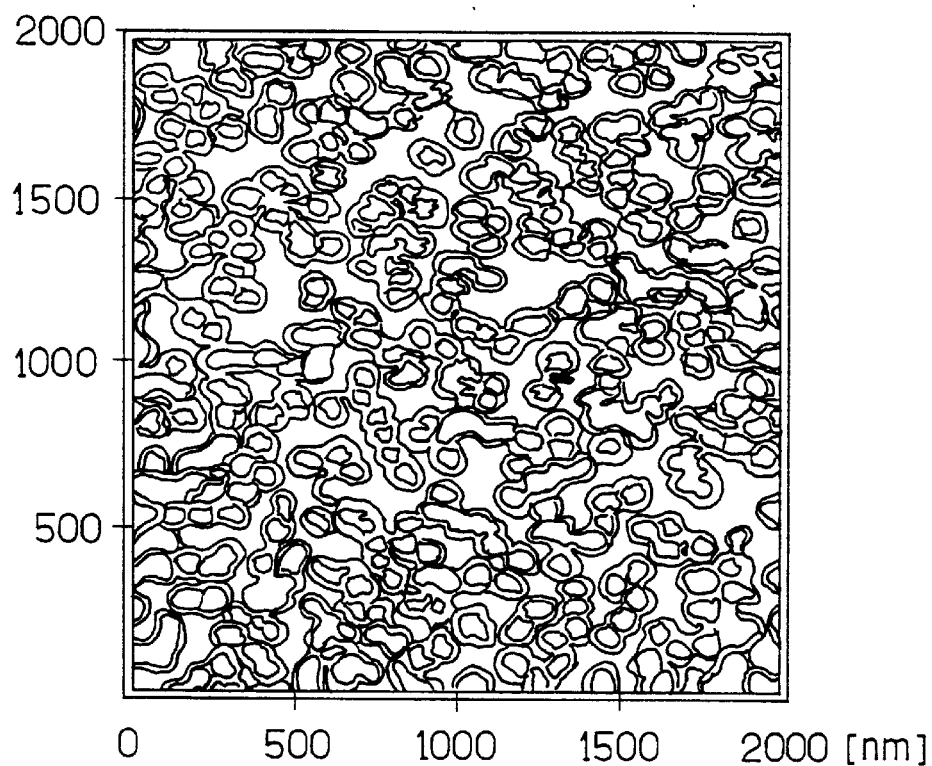
Figure 11B:
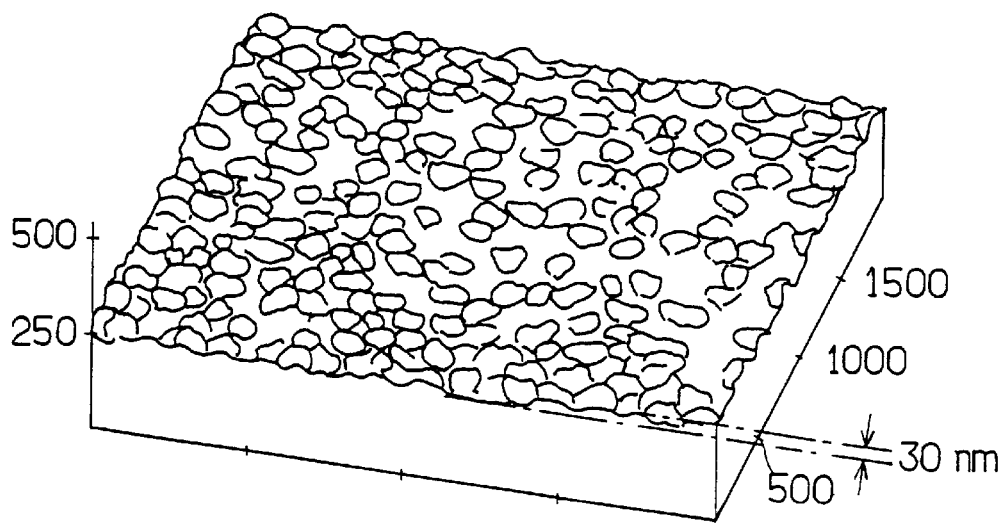

FIGS. 10A and 10B are views of surface observation of the wiring (polysilicon thin film) 2 that has been formed at a low temperature. FIG. 10A is an illustrative view of a photograph of the surface of the wiring 2 that has been taken from above and FIG. 10B is a perspective view thereof. As seen from these views, an irregularities portion that has a level difference of 140 nm or more between the crest and trough thereof is formed on the surface of the wiring. By performing LPCVD with respect to the wiring 2 so that the surface thereof may have this level difference, even if no special process step for forming an irregularities portion (for example, a process step for forming it by ion irradiation or etching) is added, it is possible to form such an irregular surface easily. It is to be noted that the level difference of the irregularities surface need not be 140 nm or more as illustrated in FIG. 10B, and it is sufficient that this level difference be 30 nm or more as illustrated in FIGS. 11A and 11B. However, the level difference preferably is 100 nm or more.

Figure 7:
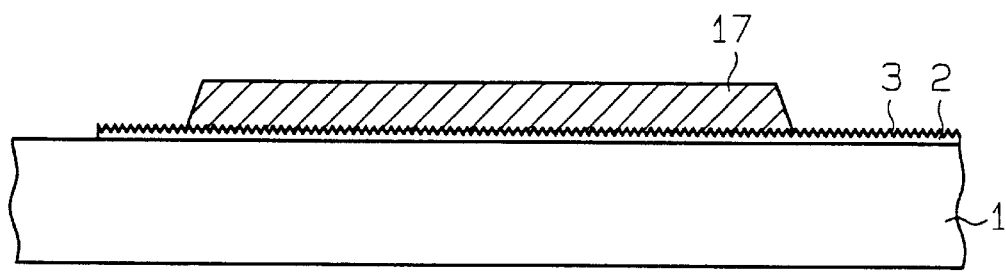
Figure 8:
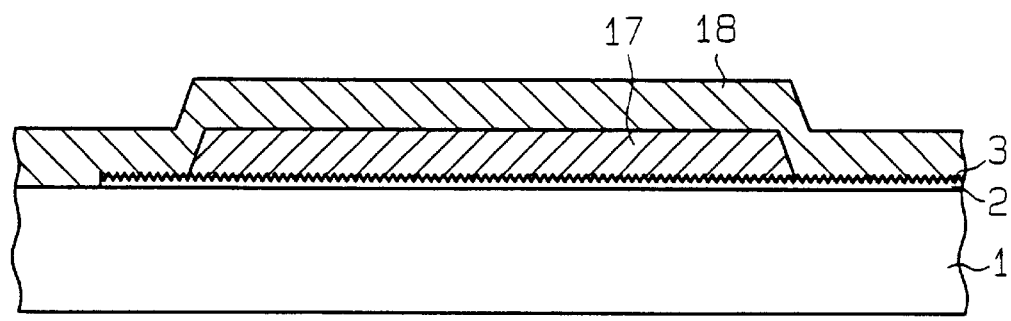

Thereafter, as illustrated in FIG. 7, the wiring (polysilicon thin film) 2 is patterned into a prescribed configuration. Further, a silicon oxide film 17 that serves as a sacrificial layer is formed on the wiring (polysilicon thin film) 2 over an entire surface thereof by plasma enhanced CVD or the like and then patterned into a prescribed configuration. Then, as illustrated in FIG. 8, a polysilicon thin film 18 that serves as a movable portion forming thin film is deposited by the LPCVD technique. This film deposition is performed at a high temperature of approximately 800° C. By this high temperature film deposition, the surface of the polysilicon thin film 18 becomes flat.

Figure 9:
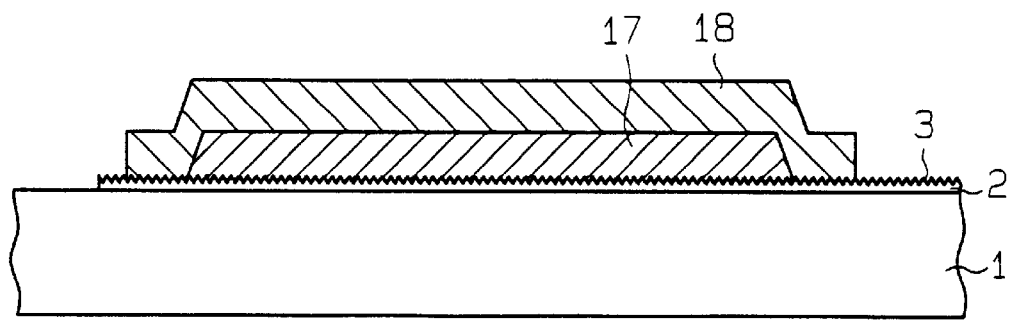

Next, as illustrated in FIG. 9, the polysilicon thin film 18 is patterned into the configuration of the movable portion 5. Namely, the anchor portions 6, beam portions 7, weight portion 8 and movable gate electrode portions 9 and 10 are collectively formed simultaneously.

Figure 45:
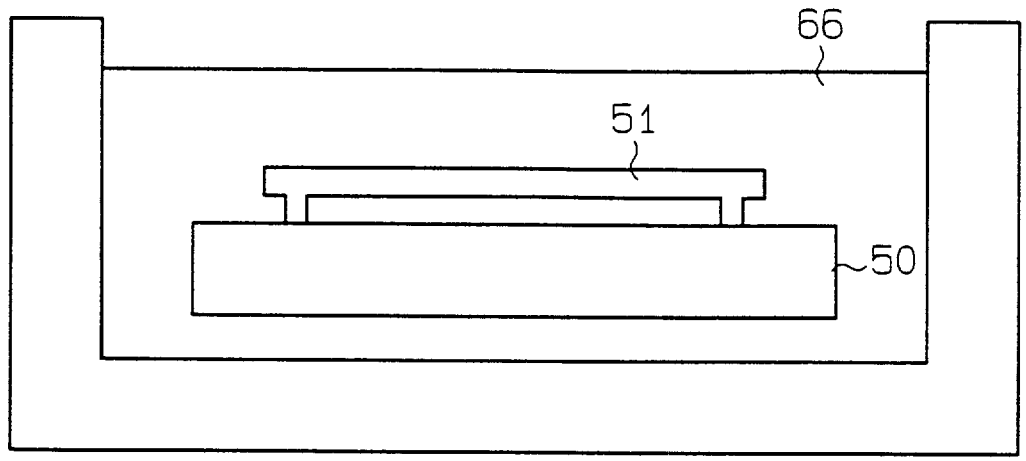

Lastly, the silicon substrate 1 is immersed into an HF solution that serves as an etching solution (as in the case of FIG. 45) to thereby etch the silicon oxide film 17 beneath the movable portion forming region. As a result, as illustrated in FIG. 2, the beam-structural movable portion 5 is disposed over the wiring (polysilicon thin film) 2 at a prescribed distance therefrom.

Figure 46:
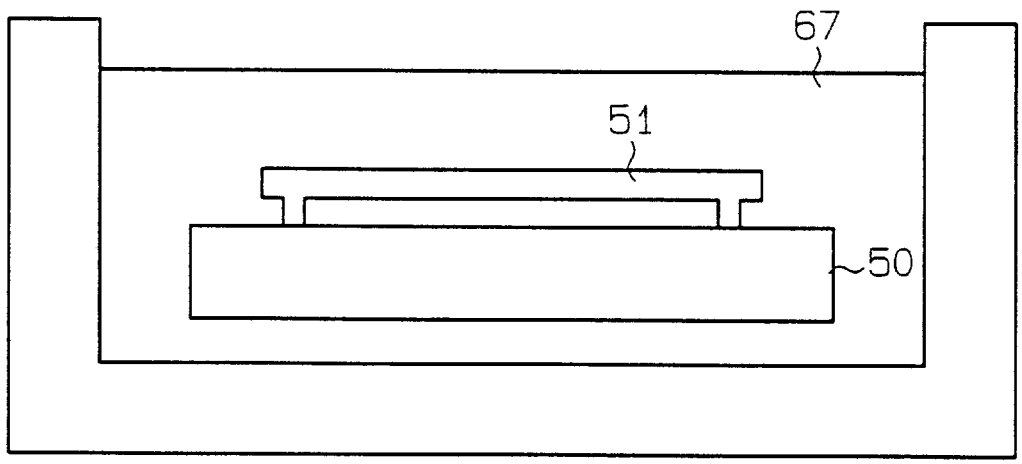
Figure 47:
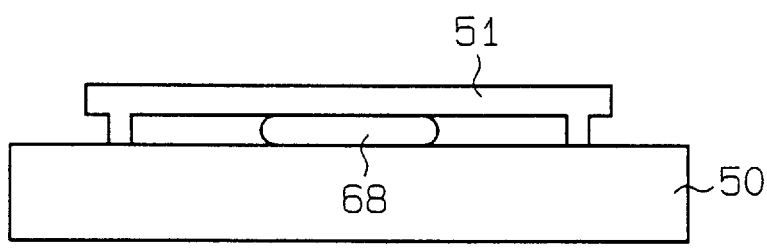
Figure 48:
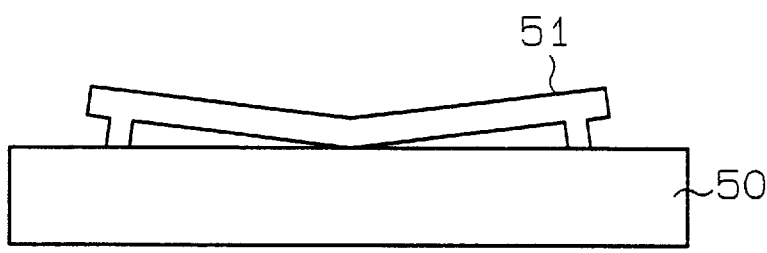

Then, the silicon substrate 1 is taken out from the HF solution. Since in this state the HF solution is kept adhering to the surface of the substrate, the silicon substrate 1 is immersed into pure water (as in the case of FIG. 46). By this procedure, the sacrificial layer etching solution, i.e., HF solution, is replaced with pure water. Then, the silicon substrate 1 is taken out from the pure water and then dried. During this drying step, pure water enters between the movable portion 5 and the substrate 1, with the result that liquid droplets adhere between the movable portion 5 and the silicon substrate 1. At this time, although the movable portion 5 is attracted toward the surface of the substrate, the movable portion 5 is prevented from adhering to the surface of the substrate by the irregularities portion 3 provided on the upper surface of the wiring (polysilicon thin film) 2.

As mentioned above, in this embodiment, on the flat surface of the silicon substrate 1 in at least a region where distance between the silicon substrate 1 and the movable portion 5 becomes the shortest there is formed the wiring 2 that is the underlying film 17 having the irregularities portion 3. On the wiring 2 there is formed the silicon oxide film 17 that serves as the sacrificial layer, on which the polysilicon oxide film 18 that serves as the movable portion forming thin film is formed. Then, the silicon oxide film 17 located beneath the polysilicon thin film 18 is removed by wet etching to thereby form the movable portion 5 that is of a beam structure. In this step, since the irregularities portion 3 is formed in the region where the distance between the substrate and the movable portion 5 becomes the shortest, the movable portion 5 is prevented from adhering to the substrate by an etchant-replacing liquid (pure water, etc.) or cleaning liquid or the like.

Also, since the underlying film is a polysilicon thin film, it becomes possible to form the irregularities portion 3 by performing film deposition at a decreased temperature as the film forming conditions, whereby it is possible to form the irregularities portion easily.

Also, since the underlying film is material that can be utilized for the wiring, and therefore a single-purpose film need not be used with respect thereto, manufacture becomes easy.

Additionally, since the wiring 2 that is constituted by the underlying film is formed right beneath the movable portion 5 excluding the movable gate electrode portions 9 and 10, as illustrated in a plan view of FIG. 1, and this wiring 2 is electrically connected to the movable portion 5 by means of the anchor portions 6, at the sensing operation time it is possible to make this wiring 2 have the same potential as that of the movable portion 5. As a result, during the sensing operation it is possible to prevent the movable portion 5 from being attracted toward the silicon substrate 1.

Also, the stationary electrodes 12 and 13 that form the source and drain portions respectively are composed of diffusion layers respectively, and these electrodes are ones for converting the displacement of the movable portion 5 to electric signals. Since these stationary electrodes 12 and 13 are formed in the surface portion of the silicon substrate 1 that is apart from a surface portion where the underlying film 2 is disposed, it is possible to prevent the surface irregularities thereof from adversely affecting the electric signals that are detected.

That is, since the surface of the substrate between the stationary electrodes 12 and 13 are flat, the electric current flowing therethrough flows smoothly. Conversely, when irregularities are formed on this surface between both stationary electrodes 12 and 13, there is the likelihood that the mobility of the carriers remarkably decreases, with the result that fluctuations occur in the electric signals that are detected. Further, when this mobility decreases, there is the likelihood that temperature variations occur at this irregularities surface portion, with the result that electric signals fluctuate also due to such temperature variations. However, since in the present invention the stationary electrodes 12 and 13 are formed in a region that is apart from the region where the underlying film 2 is disposed, it is possible to prevent the irregularities of the surface from causing fluctuations in the electric signals that are detected.

The film forming conditions for performing LPCVD for the deposition of a film having a surface that has the level difference as illustrated in FIGS. 10A and 10B may also be instead of those mentioned previously, for example, such that the flowrate of $SiH_4$ is 80 sccm under a substrate temperature of 600° C. and the within-chamber pressure at the deposition time is 184 mTorr. Also, the film forming conditions for performing LPCVD for the deposition of a film having a surface that has the level difference as illustrated in FIGS. 11A and 11B may also be, for example, such that the flowrate of $SiH_4$ is 80 sccm under a substrate temperature of 570° C. and the within-chamber pressure at the deposition time is 167 mTorr.

Also, in a case where a polysilicon film having a surface such as that illustrated in FIGS. 10A and 10B and in FIGs. 11A and 11B is deposited, the following relationship holds true when the flowrate of $SiH_4$ is made to be 80 sccm. That is, when the deposition pressure is fixed (e.g., any one of 160 to 190 mTorr), the level difference becomes larger when the substrate temperature is made to be lower (e.g., 600° C. or less) whereas when the substrate temperature is fixed (e.g., 570° C. to 600° C.), the level difference becomes larger when the deposition pressure is made to be higher (160 mTorr or more).

(SECOND EMBODIMENT)

Next, a second embodiment of the present invention will be explained with a focus on points of difference thereof with respect to the first embodiment.

Figure 12:
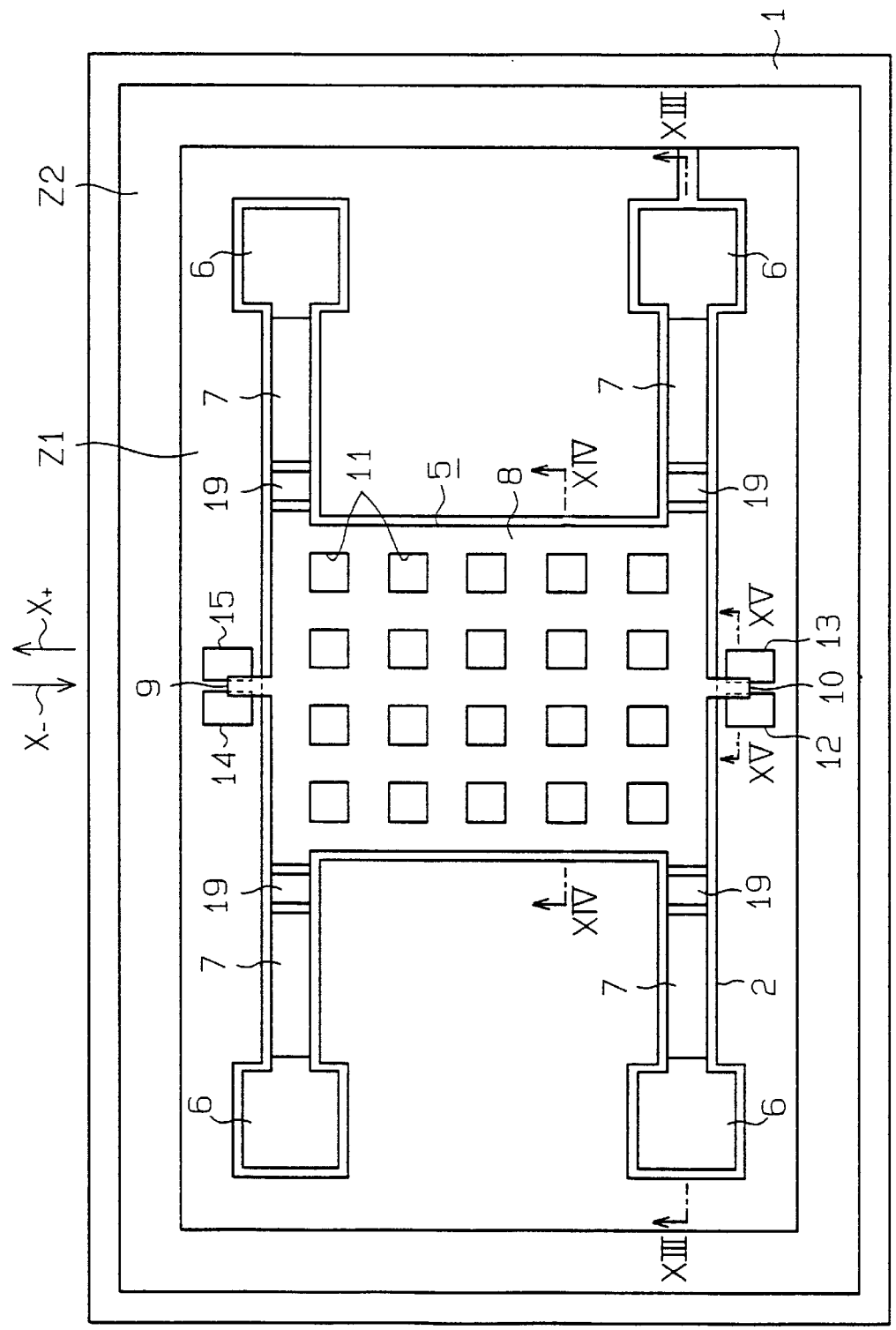
FIG. 12 is a plan view illustrating a semiconductor acceleration sensor according to a second embodiment of the present invention.
Figure 13:
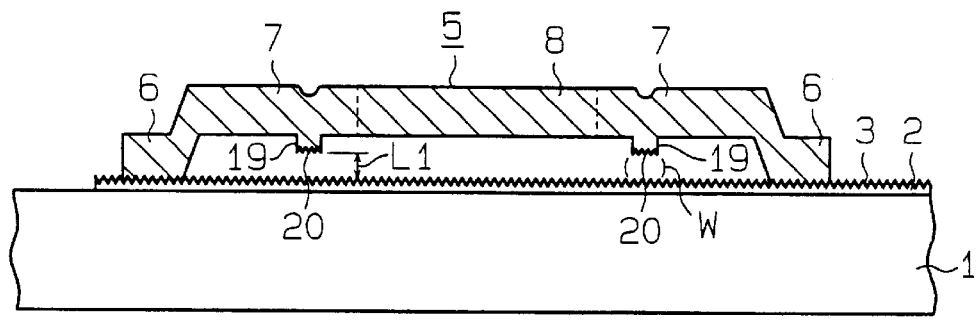
FIG. 13 is a sectional view taken along line XIII—XIII of FIG. 10.
Figure 14:
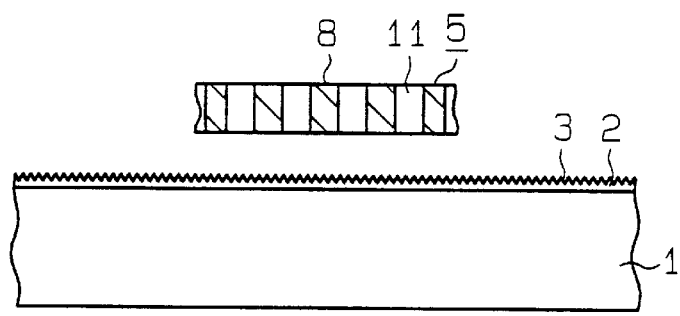
FIG. 14 is a sectional view taken along line XIV—XIV of FIG. 10.
Figure 15:
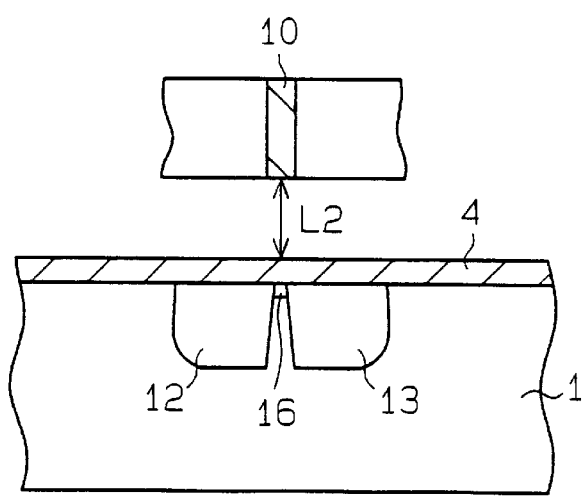
FIG. 15 is a sectional view taken along line XV—XV of FIG. 10.

FIG. 12 is a plan view illustrating a semiconductor acceleration sensor according to this embodiment. FIG. 13 is a sectional view taken along line XIII—XIII of FIG. 12, FIG. 14 is a sectional view taken along line XIV—XIV of FIG. 12, and FIG. 15 is a sectional view taken along line XV—XV of FIG. 12.

In the present sensor, on the underside of a portion of each beam portion 7 in the vicinity of the weight portion 8 there is provided a protrusion 19. As illustrated in FIG. 13, the air gap (spacing) L1 between the protrusion 19 and the substrate 1 (wiring 2) is made to be smaller than the distance L2 between the movable gate electrode portion 9, 10 and the silicon oxide film 4. As a result, in a range of ordinary acceleration, the sensor functions as a normal acceleration sensor whereas when excessive acceleration has been applied to the surface of the silicon substrate 1 vertically with respect thereto, excessive deformation of the movable portion 5 is suppressed by the protrusions 19 although the movable portion 5 tends to be deformed by such excessive acceleration vertically to the surface of the substrate. Namely, the protrusions 19 contact the wiring 2 before the movable gate electrode portions 9 and 10 contact the silicon oxide film 4, whereby deterioration in the characteristics of the MISFET is avoided. In this manner, the protrusions 19 function as a movable-range restricting portion.

An irregularities portion 20 is formed on the underside of this protrusion 19.

Next, the manufacturing process steps for manufacturing the acceleration sensor will be explained with reference to FIGS. 16 to 21. Each of views in FIGS. 16 to 21 corresponds to a state of section XIII—XIII of FIG. 12.

Figure 16:
FIGS. 16 to 21 are sectional views illustrating process steps for manufacturing the semiconductor acceleration sensor.
Figure 17:
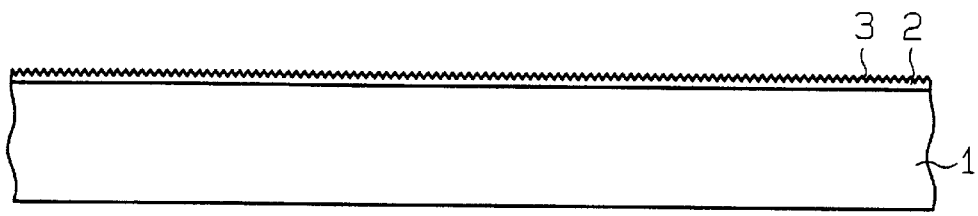

As illustrated in FIG. 16, a P-type silicon substrate 1 is first prepared. Then, as illustrated in FIG. 17, the wiring 2 composed of a polysilicon thin film is formed by a LPCVD technique. At this time, film deposition is performed at a low temperature of approximately 620° C. to thereby form the irregularities portion 3 on the surface of the wiring (polysilicon thin film) 2.

Figure 18:
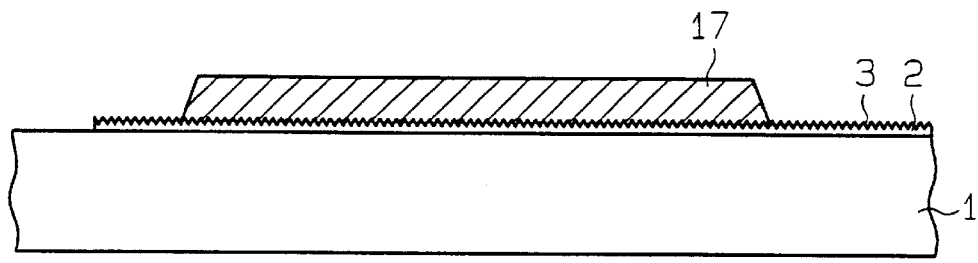
Figure 19:
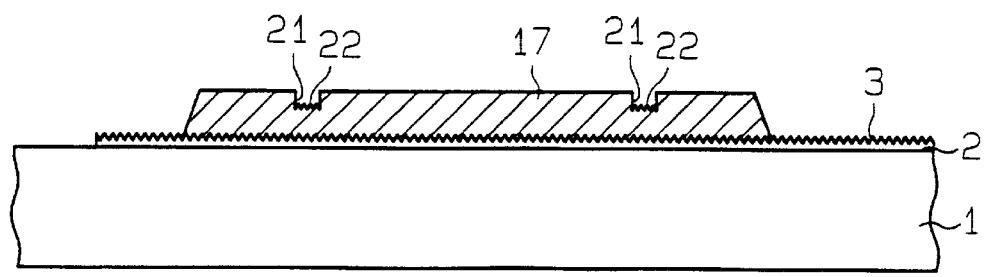

Subsequently, as illustrated in FIG. 18, the wiring (polysilicon thin film) 2 is patterned into a prescribed configuration. Then, a silicon oxide film 17 as the sacrificial layer is formed on the wiring (polysilicon thin film) 2 over an entire surface of the substrate by plasma enhanced CVD, etc., and then this silicon oxide film 17 is patterned into a prescribed configuration. Thereafter, as illustrated in FIG. 19, concavities 21 are formed, using a patterned photoresist, on the silicon oxide film 17 at regions corresponding to protrusion 19 forming regions by a RIE technique. At this time, by adjusting the voltage applied to the electrodes of the RIE system or the gas pressure, irregularities portions 22 are formed on the bottom surfaces of the concavities 21.

Figure 20:
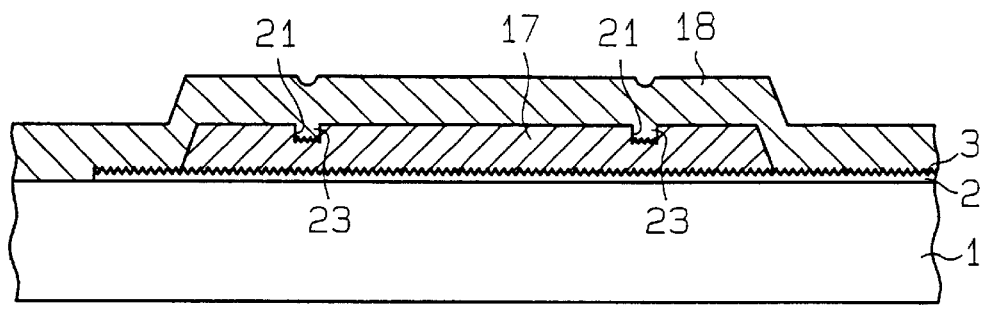

Thereafter, as illustrated in FIG. 20, the polysilicon thin film 18 that serves as the movable portion forming thin film is deposited by a LPCVD technique. At this time, film deposition is performed at a high temperature of approximately 800° C. to thereby make the surface of the polysilicon thin film 18 flat. Also, the configuration of the underlying layer is reflected with respect to the polysilicon thin film 18, whereby protrusion forming portions 23 are formed within the concavities 21.

Figure 21:
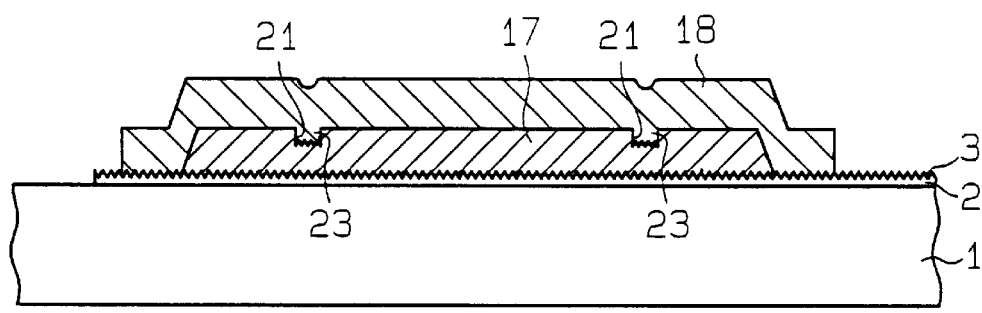

Next, as illustrated in FIG. 21, the polysilicon thin film 18 is patterned into the configuration of the movable portion 5. Namely, the anchor portions 6, beam portions 7, weight portion 8 and movable gate electrode portions 9 and 10 are collectively formed simultaneously.

Lastly, the silicon substrate 1 is immersed into an HF solution that serves as an etching solution (as in the case of FIG. 45) to thereby etch the silicon oxide film 17 beneath the movable portion forming region that serves as the sacrificial layer. As a result, as illustrated in FIG. 13, the beam-structural movable portion 5 having the protrusions 19 on the underside thereof is disposed over the wiring (polysilicon thin film) 2 at a prescribed distance therefrom.

Then, the silicon substrate 1 is taken out from the HF solution. Since in this state the HF solution is kept adhering to the surface of the substrate, the silicon substrate 1 is put into pure water (as in the case of FIG. 46). By this procedure, the sacrificial layer etching solution is replaced with pure water. Then, the silicon substrate 1 is taken out from the pure water and then dried. During this drying step, pure water enters into between the movable portion 5 and the substrate 1, with the result that liquid droplets (indicated by W in FIG. 13) adhere between the movable portion 5 and the silicon substrate 1. However, since the irregularities portions 20 are provided on the undersides of the protrusions 19 and the irregularities portion 3 is provided on the upper surface of the wiring 2, the movable portion 5 is prevented from adhering to the substrate by the etchant-replacing liquid (pure water, etc.).

In this case, the configuration of the irregularities portion 20 provided on the underside of the movable portion 5 is differentiated from the configuration of the irregularities portion 3 of the wiring 2. Therefore, it becomes difficult for the irregularities portion 20 and the irregularities portion 3 to come into close contact with each other whereby the movable portion 5 adheres to the substrate. Namely, by differentiating the configurations of the opposing irregularities portions 20 and 3 from each other, it does not happen that both of the opposing irregularities portions adhere to each other, i.e., the adherence therebetween is avoided reliably. Also, instead of making differentiation between the irregularities configuration of the irregularities portion 20 and the irregularities configuration of the irregularities portion 3 of the wiring 2, both irregularities portions 20 and 3 may be disposed to be displaced from each other so that even when both configurations are the same, the crests and troughs of one may be brought out of coincidence with the crests and troughs of the other. For example, both may be disposed such that the crests of one and the crests of the other or the troughs of one and the troughs of the other oppose each other. With this disposition as well, it does not happen that both of the opposing irregularities portions adhere to each other, i.e., the adherence therebetween is avoided reliably.

As mentioned above, in this embodiment, on the surface of the silicon substrate 1 there is formed the wiring 2 that is the underlying film having the irregularities portion 3. On the wiring 2 there is formed the silicon oxide film 17 that serves as the sacrificial layer having the irregularities portion 22, in at least a region thereof where the spacing between the silicon substrate 1 and the movable portion 5 becomes the smallest. Then, on the silicon oxide film 17 there is formed the polysilicon thin film 18 that serves as the movable portion forming thin film. Then, the silicon oxide film 17 beneath the polysilicon thin film 18 is removed by wet etching to thereby form the movable portion 5 that is of a beam structure. In this step, the movable portion 5 is prevented from adhering to the substrate 1 by the irregularities portions 3 and 20 that have been disposed in such a manner as to oppose each other.

(THIRD EMBODIMENT)

Next, a third embodiment of the present invention will be explained with a focus on points of difference thereof with respect to the second embodiment.

Figure 22:
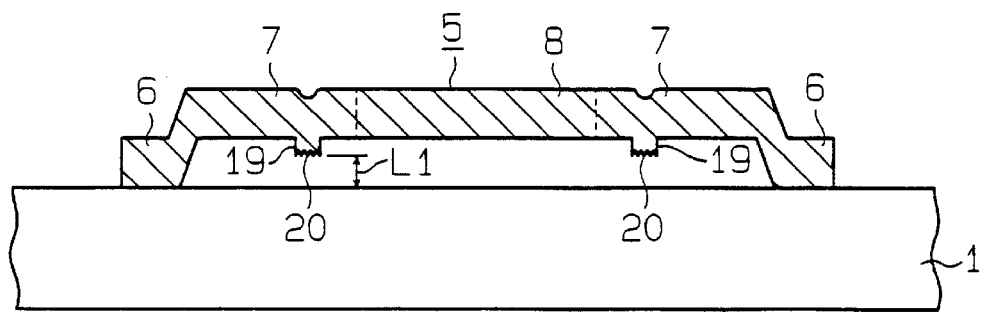
FIG. 22 is a sectional view illustrating a semiconductor acceleration sensor according to a third embodiment of the present invention.

In FIG. 22 there is illustrated a section of a semiconductor acceleration sensor according to this embodiment and this figure corresponds to FIG. 13.

In the present sensor, although the protrusions 19 are provided on the underside of the movable portion 5 as in the case of the second embodiment, the wiring 2 with the irregularities portion 3 thereon is not provided in the structure thereof.

The manufacturing process steps for manufacturing the acceleration sensor will now be explained with reference to FIGS. 23 to 27.

Figure 23:
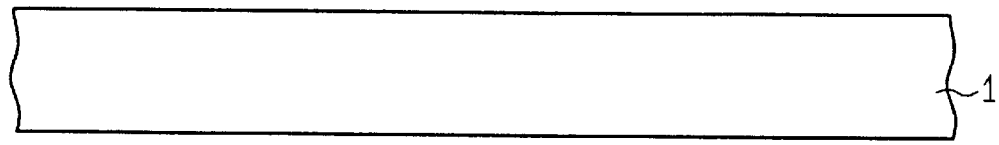
FIGS. 23 to 27 are sectional views illustrating process steps for manufacturing the semiconductor acceleration sensor.
Figure 24:
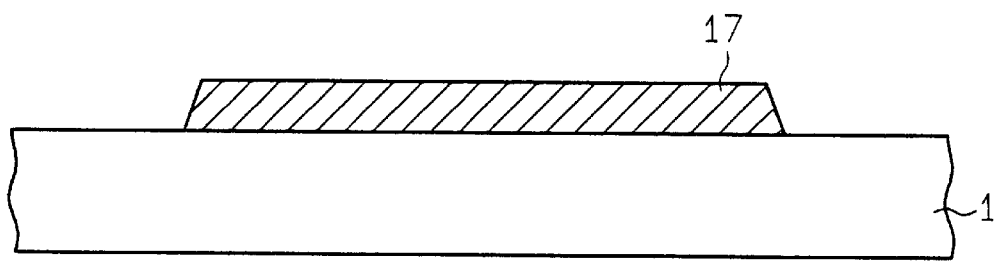
Figure 25:
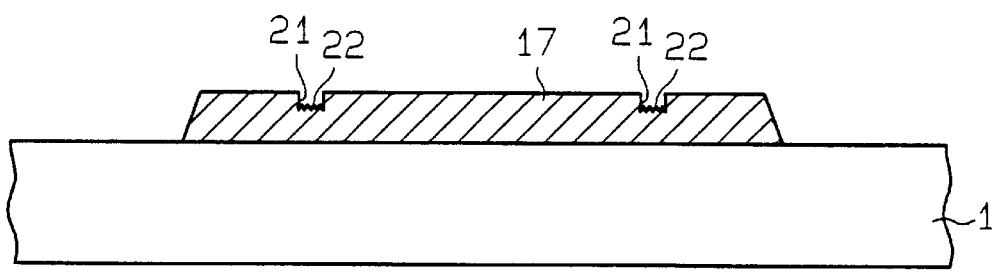

As illustrated in FIG. 23, a P-type silicon substrate 1 is first prepared. Then, as illustrated in FIG. 24, a silicon oxide film 17 that serves as the sacrificial layer is formed on the silicon substrate 1 over an entire surface thereof by plasma enhanced CVD, etc., and then this silicon oxide film 17 is patterned into a prescribed configuration. Thereafter, as illustrated in FIG. 25, patterning is performed with respect to a photoresist in correspondence with protrusion 19 forming regions of the silicon oxide film 17 whereupon irradiation of active ions is performed thereon by a RIE technique to thereby form concavities 21. At this time, by adjusting the voltage applied to the electrodes of the RIE system or the gas pressure, irregularities portions 22 are formed on the bottom surfaces of the concavities 21.

Figure 26:
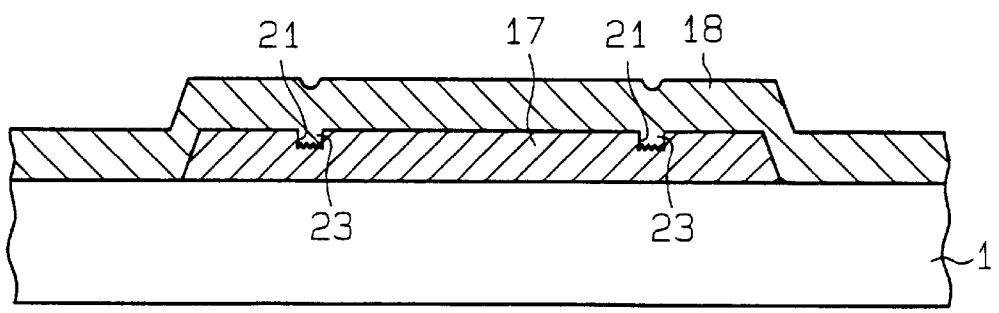

Thereafter, as illustrated in FIG. 26, the polysilicon thin film 18 that serves as the movable portion forming thin film is deposited by a LPCVD technique (approximately 800° C.). At this time, the configuration of the underlying layer is reflected with respect to the polysilicon thin film 18, whereby protrusion forming portions 23 are formed within the concavities 21.

Figure 27:
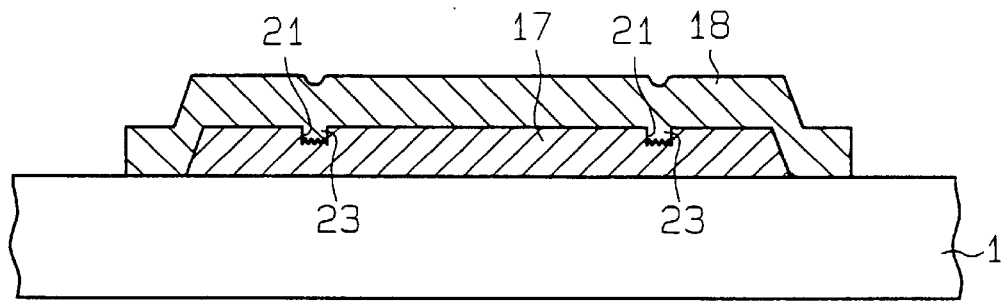

Next, as illustrated in FIG. 27, the polysilicon thin film 18 is patterned into the configuration of the movable portion 5. Namely, the anchor portions 6, beam portions 7, weight portion 8 and movable gate electrode portions 9 and 10 are collectively formed simultaneously.

Lastly, as illustrated in FIG. 22, by wet etching, the beam-structural movable portion 5 having the protrusions 19 on the underside thereof is disposed over the silicon substrate 1 at a prescribed distance therefrom. At this time, since the irregularities portions 20 are provided on the undersides of the protrusions 19, the movable portion 5 is prevented from adhering to the substrate 1 by the etchant-replacing liquid (pure water, etc.).

As mentioned above, in this embodiment, on the surface of the silicon substrate 1 in at least a region where the spacing between the silicon substrate 1 and the movable portion 5 becomes the smallest there is formed the silicon oxide film 17 that serves as the sacrificial layer having the irregularities portion 22. Then, on the silicon oxide film 17 there is formed the polysilicon thin film 18 that serves as the movable portion forming thin film. Then, the silicon oxide film 17 beneath the polysilicon thin film 18 is removed by wet etching to thereby form the movable portion 5 that is of a beam structure whose underside includes the irregularities portions 20 formed by means of the irregularities portions 22. In this step, the movable portion 5 is prevented from adhering to the substrate 1 by the irregularities portions 20.

(FOURTH EMBODIMENT)

Next, a fourth embodiment of the present invention will be explained with a focus on points of difference thereof with respect to the second embodiment.

Figure 28:
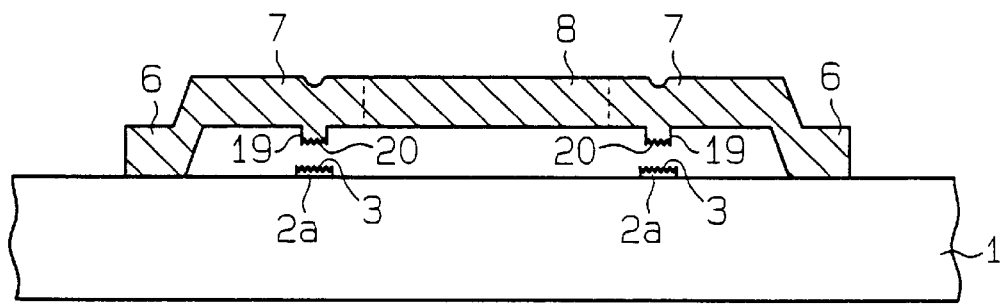
FIG. 28 is a sectional view illustrating a semiconductor acceleration sensor according to a fourth embodiment of the present invention.

In FIG. 28 there is illustrated a section of the sensor according to this embodiment and this figure corresponds to FIG. 13.

In the present sensor, on the underside of the movable portion 5 there are provided the protrusions 19 as in the case of the second embodiment. At only the positions that correspond to the protrusions 19, there are disposed wiring thin films (hereinafter referred to simply as "wiring") 2a having the irregularities portions 3 on the surfaces thereof.

Next, the manufacturing process steps for manufacturing the acceleration sensor will be explained with reference to FIGS. 29 to 34.

Figure 29:
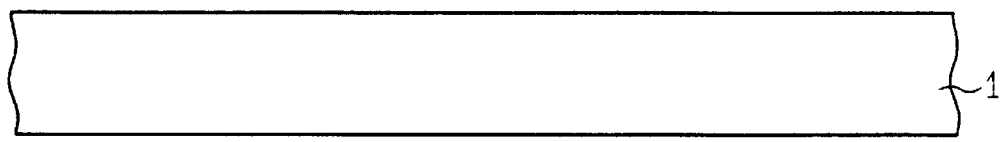
FIGS. 29 to 34 are sectional views illustrating process steps for manufacturing the semiconductor acceleration sensor.
Figure 30:
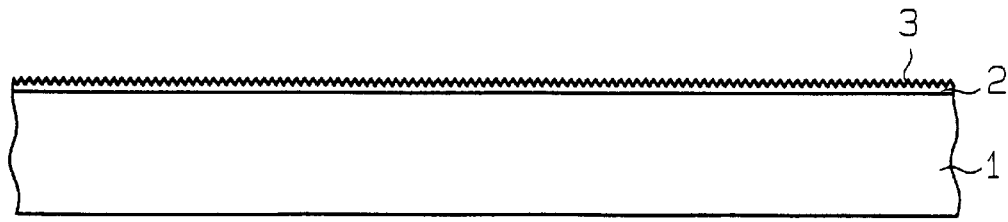

As illustrated in FIG. 29, a P-type silicon substrate 1 is first prepared. Then, as illustrated in FIG. 30, the wiring 2 of a polysilicon thin film is formed by a LPCVD technique. At this time, film deposition is performed at a low temperature of approximately 620° C. to thereby form the irregularities portion 3 on the surface of the wiring (polysilicon thin film) 2.

Figure 31:
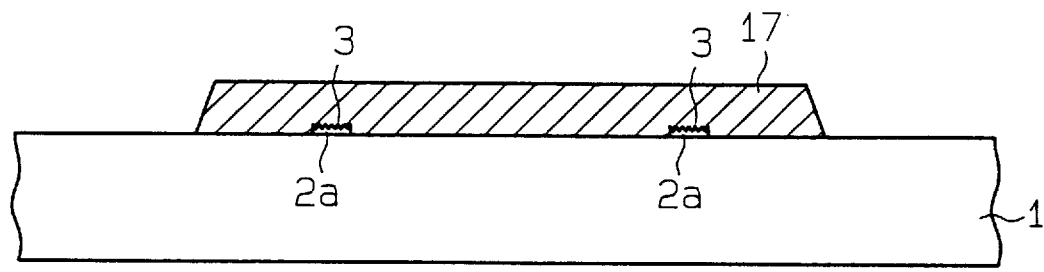
Figure 32:
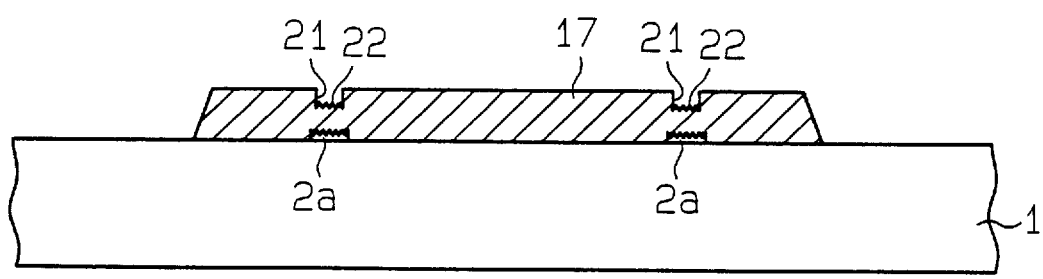

Subsequently, as illustrated in FIG. 31, the wiring (polysilicon thin film) 2 is patterned into a prescribed configuration. At this time, the wirings 2a are made to remain in the regions that oppose the protrusions 19 of FIG. 28. Then, a silicon oxide film 17 that serves as the sacrificial layer is formed on the wirings (polysilicon thin film) 2a over the entire surface including the same by plasma enhanced CVD, etc., and then this silicon oxide film 17 is patterned into a prescribed configuration. Thereafter, as illustrated in FIG. 32, patterning is performed with respect to a photoresist in correspondence with protrusion 19 forming regions of the silicon oxide film 17 whereupon irradiation of active ions is performed thereon by RIE technique to thereby form concavities 21. At this time, by adjusting the voltage applied to the electrodes of the RIE system or the gas pressure, irregularities portions 22 are formed on the bottom surfaces of the concavities 21.

Figure 33:
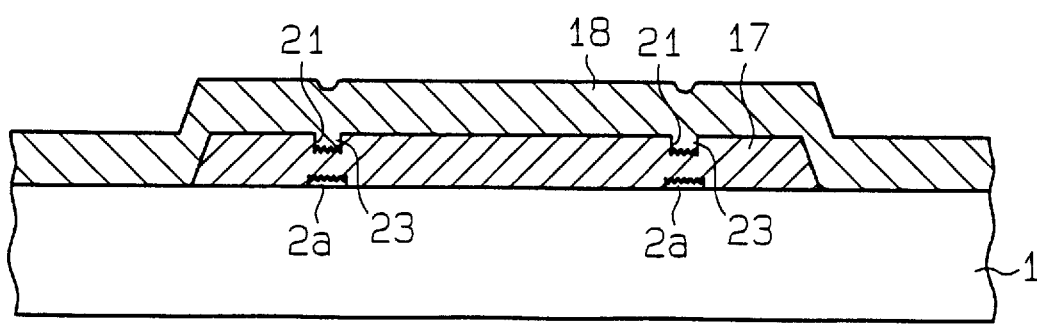

Thereafter, as illustrated in FIG. 33, the polysilicon thin film 18 that serves as the movable portion forming thin film is deposited by a LPCVD technique. At this time, film deposition is performed at a high temperature of approximately 800° C. to thereby make the surface of the polysilicon thin film 18 flat. Also, the configuration of the underlying layer is reflected on the polysilicon thin film 18, whereby protrusion forming portions 23 are formed within the concavities 21.

Figure 34:
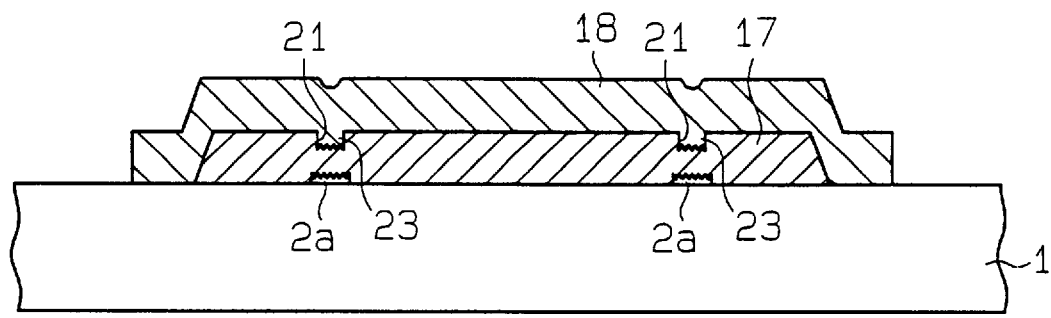

Next, as illustrated in FIG. 34, the polysilicon thin film 18 is patterned into the configuration of the movable portion 5. Namely, the anchor portions 6, beam portions 7, weight portion 8 and movable gate electrode portions 9 and 10 are collectively formed simultaneously.

Lastly, as illustrated in FIG. 28, by wet etching, the beam-structural movable portion 5 having the protrusions 19 on the underside thereof is disposed over the substrate 1 (wiring 2a) at a prescribed distance therefrom. At this time, since the irregularities portions 20 are provided on the undersides of the protrusions 19 and the irregularities portions 3 are provided on the upper surface of the wirings 2a, the movable portion 5 is prevented from adhering to the substrate 1 by the etchant-replacing liquid (pure water, etc.) or cleaning liquid or the like.

As mentioned above, in this embodiment, on the surface of the silicon substrate 1 in at least a region where the spacing between the silicon substrate 1 and the movable portion 5 becomes the smallest there are formed the wirings 2a that are the underlying film having the irregularities portions 3. On the wirings 2a there is formed the silicon oxide film 17 that serves as the sacrificial layer having the irregularities portions 22 in at least the protrusion forming regions that correspond to the irregularities portions 3. Then, on the silicon oxide film 17 there is formed the polysilicon thin film 18 that serves as the movable portion forming thin film. Then, the silicon oxide film 17 beneath the polysilicon thin film 18 is removed by wet etching to thereby form the movable portion 5 that is of a beam structure. In this etching step, the movable portion 5 can be prevented from adhering to the substrate 1 by the irregularities portions 3 and 20 that have been disposed in such a manner as to oppose each other.

(FIFTH EMBODIMENT)

Next, a fifth embodiment of the present invention will be explained with a focus on points of difference thereof with respect to the third embodiment.

Figure 35:
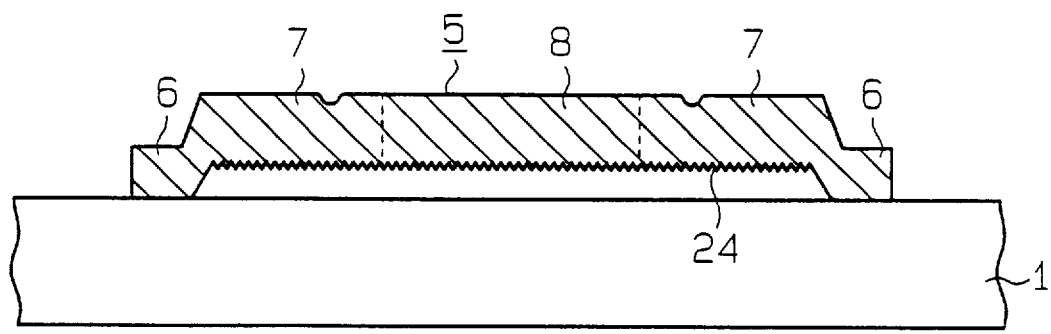
FIG. 35 is a sectional view illustrating a semiconductor acceleration sensor according to a fifth embodiment of the present invention.

In FIG. 35 there is illustrated a section of the sensor according to this embodiment and this figure corresponds to FIG. 22.

In the present sensor, on the underside of the movable portion 5 there are provided no protrusions (19) as in the case of the third embodiment, and on the entire underside thereof there is formed an irregularities portion 24.

Next, the manufacturing process steps for manufacturing the acceleration sensor will be explained with reference to FIGS. 36 to 39.

Figure 36:
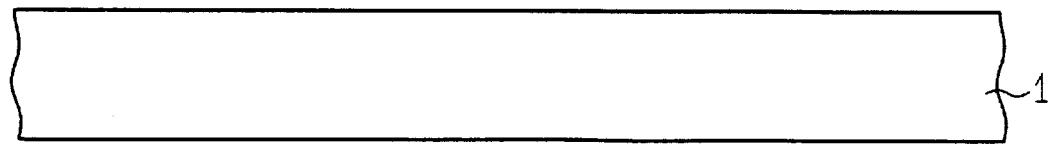
FIGS. 36 to 39 are sectional views illustrating process steps for manufacturing the semiconductor acceleration sensor.
Figure 37:
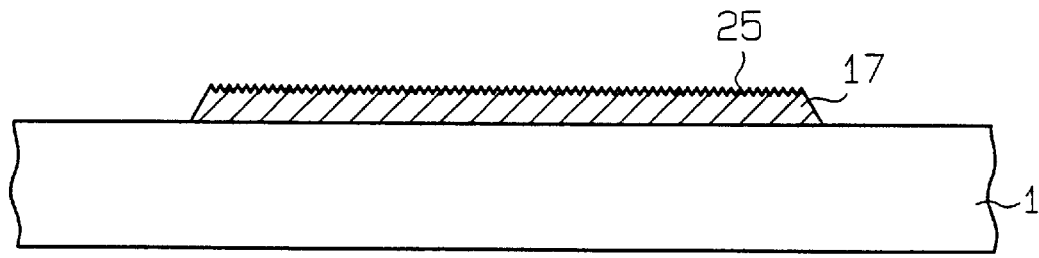

As illustrated in FIG. 36, a P-type silicon substrate 1 is first prepared. Then, as illustrated in FIG. 37, a silicon oxide film 17 that serves as the sacrificial layer is formed on the silicon substrate 1 over an entire surface thereof by plasma enhanced CVD, etc., and then this silicon oxide film 17 is patterned into a prescribed configuration. Thereafter, irradiation of active ions is performed with respect to the silicon oxide film 17 by a RIE technique to thereby form an irregularities portion 25 on the surface thereof. More specifically, by adjusting the acceleration voltage or the gas pressure, the irregularities portion 25 is formed.

Figure 38:
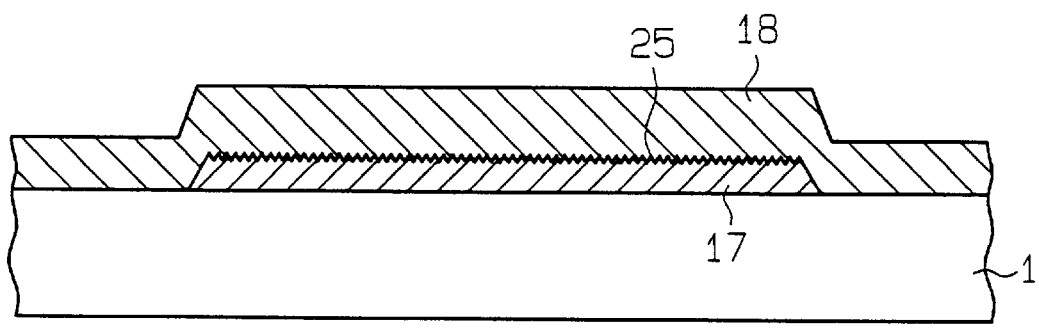

Thereafter, as illustrated in FIG. 38, the polysilicon thin film 18 that serves as the movable portion forming thin film is deposited by a LPCVD technique (approximately 800° C.).

Figure 39:
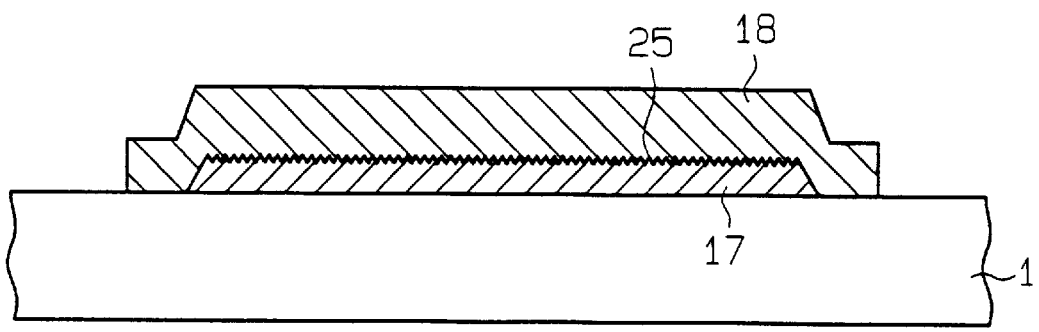
Figure 40:
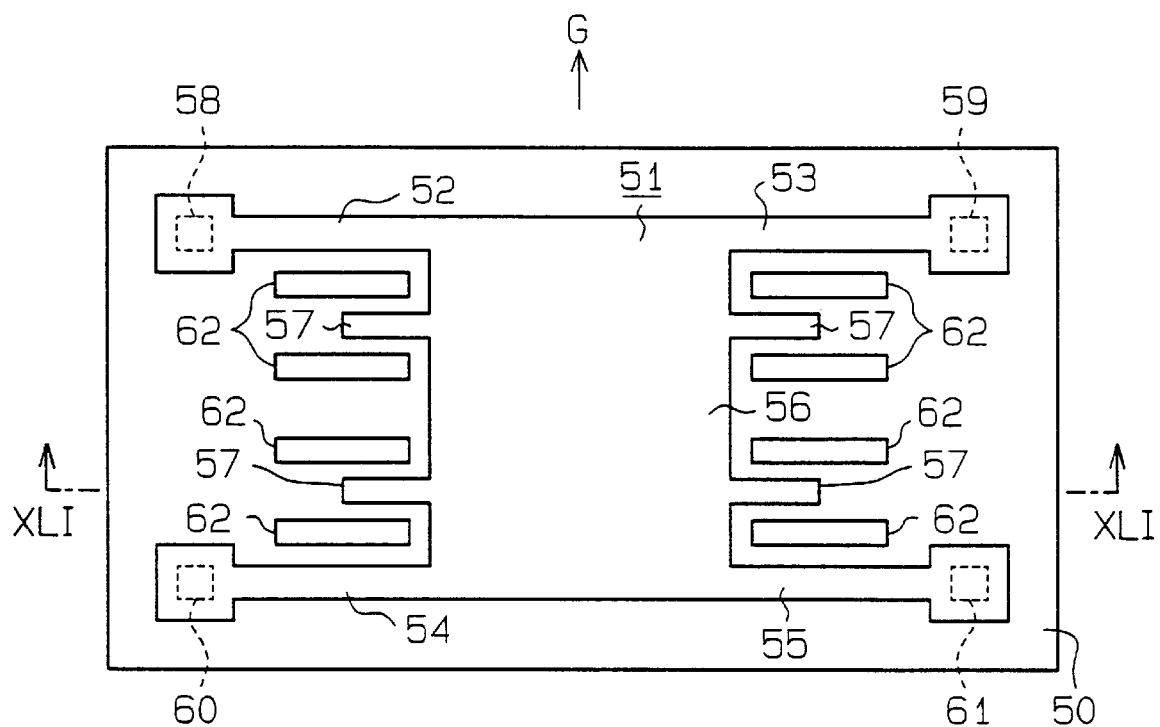
FIG. 40 is a plan view illustrating a conventional semiconductor acceleration sensor.
Figure 41:
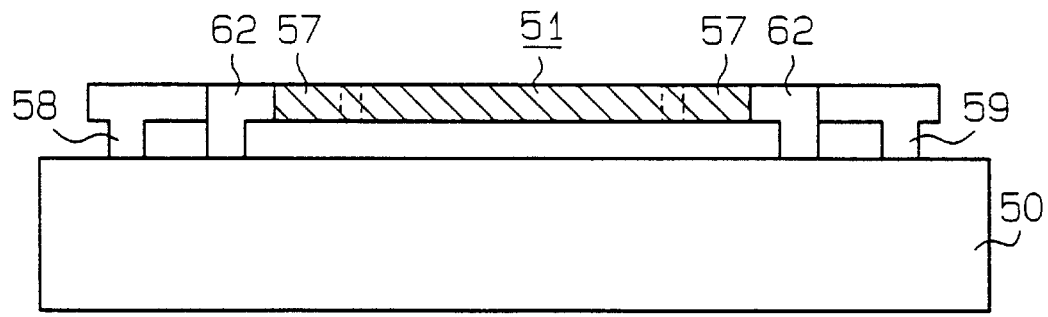
FIG. 41 is a sectional view taken along the line XLI—XLI of FIG. 40.
Figure 42:
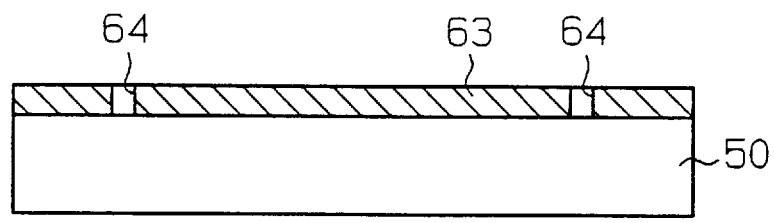
FIGS. 42 to 48 are sectional views illustrating process steps for manufacturing a conventional sensor.
Figure 43:
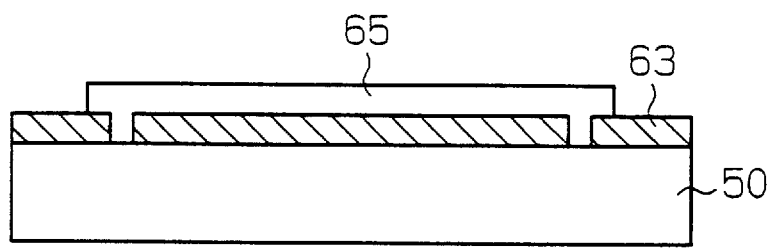
Figure 44:
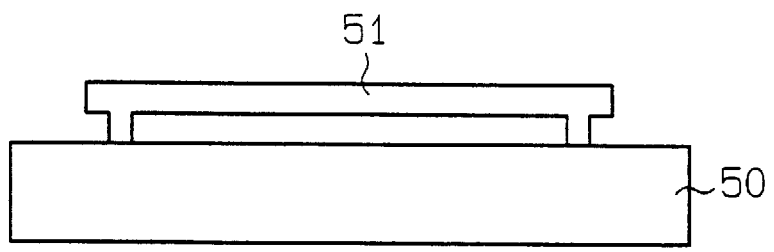

Next, as illustrated in FIG. 39, the polysilicon thin film 18 is patterned into the configuration of the movable portion 5. Namely, the anchor portions 6, beam portions 7, weight portion 8 and movable gate electrode portions 9 and 10 are collectively formed simultaneously.

Lastly, as illustrated in FIG. 35, by wet etching, the beam-structural movable portion 5 having the irregularities portion 24 on the underside thereof is disposed over the substrate 1 at a prescribed distance therefrom. At this time, since the irregularities portion 24 is provided on the underside of the movable portion 5, the movable portion 5 is prevented from adhering to the substrate by the etchant-replacing liquid (pure water, etc.) or cleaning liquid or the like.

The present invention is not limited to the above-mentioned embodiments. For example, the underlying film may be composed of material other than the polysilicon thin film (2), nor is it always necessary for the material thereof to consist of material for constituting the wiring.

Also, although in each of the above-mentioned embodiments the manufacturing process steps for manufacturing the acceleration sensor have been stated as those wherein wet etching is used as means for removing the sacrificial layer and as those for preventing adherence that occurs at the wet-etching using time, even after removal thereof with the use of dry etching, adherence resulting from the use of cleaning liquid or the like in a succeeding step can be avoided by the performance of such process steps and the resulting configuration.

Also, as the method for forming the irregularities portion on the surface of the polysilicon thin film that is the underlying film, for example, a method of increasing an amount of silane to be supplied and thereby increasing the film forming rate may be adopted in addition to the method of performing film deposition at a low temperature by use of LPCVD technique.

Further, the invention may be embodied also as the semiconductor physical-quantity sensor for detecting yaw rate, vibration, etc. as well as acceleration.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for manufacturing a semiconductor physical-quantity sensor comprising a semiconductor substrate and a movable portion of a beam structure composed of a thin film, the method comprising the steps of:

forming an underlying film having an irregularities portion on a flat surface of the semiconductor substrate in a region between the semiconductor substrate and a movable portion location;

forming a sacrificial layer on the underlying film;

forming a movable portion thin film on the sacrificial layer; and removing the sacrificial layer beneath the movable portion thin film by etching to thereby form a movable portion of the beam structure.

2. A method for manufacturing a semiconductor physical-quantity sensor as set forth in claim 1, wherein the underlying film is a polysilicon thin film.

3. A method for manufacturing a semiconductor physical-quantity sensor as set forth in claim 1, wherein the underlying film is a member forming a wiring.

4. A method for manufacturing a semiconductor physical-quantity sensor as set forth in claim 3, wherein the step of forming the movable portion thin film includes forming the movable portion thin film so that a part of the movable portion thin film contacts the underlying film.

5. A method for manufacturing a semiconductor physical-quantity sensor as set forth in claim 4, wherein the step of forming the underlying film includes depositing polycrystalline silicon on the semiconductor substrate under a condition which is selected so that irregularities are formed on the surface thereof.

6. A method for manufacturing a semiconductor physical-quantity sensor as set forth in claim 5, further comprising a step of forming a semiconductor element to detect a physical/quantity applied to the movable portion of the beam structure by converting displacement of the movable portion into electric signals.

7. A method for manufacturing a semiconductor physical-quantity sensor as set forth in claim 6, wherein the semiconductor element includes a stationary electrode disposed in a surface portion of the semiconductor substrate that is apart from the surface portion where the underlying film is disposed, the stationary electrode being composed of a diffusion layer.

8. A method for manufacturing a semiconductor physical-quantity sensor as set forth in claim 1, further comprising a step of forming a semiconductor element to detect a physical/quantity applied to the movable portion of the beam structure by converting displacement of the movable portion into electric signals.

9. A method for manufacturing a semiconductor physical-quantity sensor as set forth in claim 1, wherein the step of forming the underlying film includes depositing the underlying film under a condition which is selected so that irregularities are formed on the surface thereof.

10. A method for manufacturing a semiconductor physical-quantity sensor comprising a semiconductor substrate and a movable portion of a beam structure composed of a thin film, the method comprising the steps of:

forming a sacrificial layer having a surface irregularities portion on a surface of the semiconductor substrate in a region between the semiconductor substrate and a movable portion location;

forming a movable portion thin film on the sacrificial layer; and removing the sacrificial layer beneath the movable portion thin film by etching to thereby form a movable portion of the beam structure whose underside has an irregularities portion formed by the surface irregularities portion of the sacrificial layer.

11. A method for manufacturing a semiconductor physical-quantity sensor as set forth in claim 10, further comprising a step of forming a semiconductor element to detect a physical/quantity applied to the movable portion of the beam structure by converting displacement of the movable portion into electric signals.

12. The method of claim 10, wherein the step of forming a sacrificial layer further comprises the step of patterning the sacrificial layer to form at least one cavity therein to cause at least one protrusion to be formed during the subsequent steps of forming a movable portion thin film and removing the sacrificial layer.

13. The method of claim 12, wherein the step of removing the sacrificial layer causes the at least one protrusion to have an irregular surface region.

14. The method of claim 12, wherein the step of patterning the sacrificial layer to form at least one cavity therein comprises patterning the sacrificial layer to form a plurality of cavities therein to cause a plurality of protrusions to be formed.

15. The method of claim 14, wherein the step of removing the sacrificial layer causes the plurality of protrusions to each have an irregular surface region.

16. The method of claim 10, further comprising the step of depositing a film, on the substrate, that includes surface irregularities that oppose the irregularities portion on the underside of the movable portion.

17. A method for manufacturing a semiconductor physical-quantity sensor comprising a semiconductor substrate and a movable portion of a beam structure composed of a thin film, the method comprising the steps of:

forming an underlying film having an irregularities portion on a surface of the semiconductor substrate in a region between the semiconductor substrate and a movable portion region;

forming, on the underlying film, a sacrificial layer having a surface irregularities portion that corresponds to a part of the irregularities portion of the underlying layer;

forming a movable portion thin film on the sacrificial layer; and removing the sacrificial layer beneath the movable portion thin film by etching to thereby form the movable portion of the beam structure, the movable portion including an irregularities portion on an underside thereof formed by the surface irregularities portion of the sacrificial layer.

18. A method for manufacturing a semiconductor physical-quantity sensor as set forth in claim 17, wherein the underlying film is a polysilicon thin film.

19. A method for manufacturing a semiconductor physical-quantity sensor as set forth in claim 17, wherein the underlying film is a member forming a wiring.

20. A method for manufacturing a semiconductor physical-quantity sensor as set forth in claim 19, wherein the step of forming the movable portion thin film includes forming the movable portion thin film so that a part of the movable portion thin film contacts the underlying film.

21. A method for manufacturing a semiconductor physical-quantity sensor as set forth in claim 20, wherein the step of forming the underlying film includes depositing polycrystalline silicon on the semiconductor substrate under a condition which is selected so that irregularities are formed on the surface thereof.

22. A method for manufacturing a semiconductor physical-quantity sensor as set forth in claim 21, further comprising a step of forming a semiconductor element to detect a physical-quantity applied to the movable portion of the beam structure by converting displacement of the movable portion into electric signals.

23. A method for manufacturing a semiconductor physical-quantity sensor as set forth in claim 17, wherein the opposing irregularities portions are different in configuration from each other or are disposed in such a manner as to be displaced from each other so that crests of one of them and troughs of the other do not coincide with each other.

24. A method for manufacturing a semiconductor physical-quantity sensor as set forth in claim 17, wherein the step of forming the underlying film includes depositing the underlying film under a condition which is selected so that irregularities are formed on the surface thereof.

25. A method for manufacturing a semiconductor physical-quantity sensor as set forth in claim 17, further comprising a step of forming a semiconductor element to detect a physical-quantity applied to the movable portion of the beam structure by converting displacement of the movable portion into electric signals.

26. A method for manufacturing a semiconductor physical-quantity sensor as set forth in claim 25, wherein the semiconductor element includes a stationary electrode disposed in a surface portion of the semiconductor substrate that is apart from the surface portion where the underlying film is disposed, the stationary electrode being composed of a diffusion layer.

27. A semiconductor physical-quantity sensor comprising:

a semiconductor substrate;

a movable portion of a beam structure that is composed of a thin film and disposed over the semiconductor substrate with a cavity interposed therebetween and is displaceable in accordance with an action of a physical quantity; and an underlying film that has an irregularities surface and has conductivity and that is disposed on a surface of the semiconductor substrate in a region between the semiconductor substrate and the movable portion, wherein the underlying film is electrically connected to the movable portion.

28. The sensor of claim 27, further comprising at least one protrusion that extends from the movable portion, and that includes an end surface with an irregularities region that opposes the irregularities surface of the underlying film.

29. The sensor of claim 28, further comprising a plurality of protrusions that each include an end surface with an irregularities region that opposes the irregularities surface of the underlying film.

30. The sensor of claim 29, wherein the irregularities surface of the underlying film corresponds only to portions of the underlying film located directly underneath the end surfaces of the plurality of protrusions.

31. The sensor of claim 28, wherein the irregularities surface of the underlying film corresponds only to a portion of the underlying film located directly underneath the end surface of the at least one protrusion.

32. A method of manufacturing a semiconductor physical-quantity sensor on a semiconductor substrate, comprising:

depositing on the substrate a surface film that includes an irregular surface region;

depositing a sacrificial layer on the surface film;

depositing a movable sensor component film on the sacrificial layer; and removing the sacrificial layer beneath the movable sensor component film, by etching, to form a movable sensor component over the irregular surface region of the surface film.

33. The method of claim 32, further comprising the step of patterning the sacrificial film to form at least one cavity therein, after the step of depositing a sacrificial film, to cause at least one protrusion to be formed during the subsequent steps of depositing a movable sensor component film and removing the sacrificial layer.

34. The method of claim 33, further comprising the step of forming an irregular surface on a bottom surface of the at least one protrusion.

35. The method of claim 34, wherein the step of depositing a surface film that includes an irregular surface region comprises depositing a film that includes an irregular surface region only over a region of the substrate that will lie underneath the at least one protrusion.

36. The method of claim 33, wherein the step of patterning the sacrificial film comprises patterning the sacrificial film to form a plurality of cavities therein to cause a plurality of protrusions to be formed.

37. The method of claim 36, wherein the step of depositing a film that includes an irregular surface region only over a region of the substrate that will lie underneath the movable sensor component comprises depositing a film that includes an irregular surface region only over those regions of the substrate that will lie underneath the plurality of protrusions.

38. A semiconductor physical-quantity sensor comprising:

a semiconductor substrate;

a movable portion of a beam structure that is composed of a thin film and that is disposed over the semiconductor substrate with a cavity interposed therebetween, and is displaceable in accordance with an action of a physical quantity, the movable portion having an underside with an irregularities surface that opposes the semiconductor substrate; and an underlying film that has conductivity and that is disposed on a surface of the semiconductor substrate in a region between the semiconductor substrate and the movable portion, wherein the underlying film is electrically connected to the movable portion.

39. The sensor of claim 38, wherein the movable portion of the beam structure includes at least one protrusion including a bottom surface that comprises the underside of the movable portion having an irregularities surface.

40. The sensor of claim 38, wherein the movable portion of the beam structure includes a plurality of protrusions extending downwardly therefrom, the plurality of protrusions each including a bottom surface that comprises the underside of the movable portion having an irregularities surface.

* * * * *